United States Patent
Numagi et al.

(10) Patent No.: US 11,480,910 B2
(45) Date of Patent: Oct. 25, 2022

(54) PRINTED CIRCUIT BOARD, PRINTED WIRING BOARD, ELECTRONIC DEVICE, AND IMAGE FORMING APPARATUS

(71) Applicant: CANON KABUSHIKI KAISHA, Tokyo (JP)

(72) Inventors: Takashi Numagi, Hachioji (JP); Kunihiko Uchida, Kodama-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 63 days.

(21) Appl. No.: 16/893,506

(22) Filed: Jun. 5, 2020

(65) Prior Publication Data
US 2020/0393787 A1 Dec. 17, 2020

(30) Foreign Application Priority Data

Jun. 11, 2019 (JP) .............................. JP2019-108876
May 8, 2020 (JP) .............................. JP2020-082598

(51) Int. Cl.
*H05K 5/02* (2006.01)
*H05K 1/11* (2006.01)
*G03G 15/00* (2006.01)

(52) U.S. Cl.
CPC ............. *G03G 15/80* (2013.01); *H05K 1/115* (2013.01); *H05K 5/0247* (2013.01); *H05K 2201/09254* (2013.01); *H05K 2201/09709* (2013.01); *H05K 2201/10159* (2013.01)

(58) Field of Classification Search
CPC ......... H05K 1/115; H05K 2201/09254; H05K 2201/10159; H05K 2201/09709
See application file for complete search history.

(56) References Cited

U.S. PATENT DOCUMENTS

| 4,831,278 A * | 5/1989 | Ueda ......................... H05K 7/06 174/72 A |
| 7,728,444 B2 * | 6/2010 | Hayashi .................. H01L 23/66 257/781 |
| 10,716,211 B2 | 7/2020 | Numagi et al. |
| 2002/0176236 A1 * | 11/2002 | Iguchi .................. H05K 9/0039 361/753 |
| 2008/0025007 A1 * | 1/2008 | Ao .......................... H05K 1/115 361/760 |
| 2008/0164622 A1 | 7/2008 | Hayashi |

(Continued)

FOREIGN PATENT DOCUMENTS

JP 2008-171950 A 7/2008

*Primary Examiner* — Hung V Ngo
(74) *Attorney, Agent, or Firm* — Venable LLP

(57) ABSTRACT

A printed circuit board includes a printed wiring board, and a first element and a second element mounted on the printed wiring board. The printed wiring board includes a plurality of first signal lines and a plurality of second signal lines. The plurality of first signal lines each include a first main line, a first branch line, and a second branch line. The plurality of second signal lines each include a second main line, a third branch line, and a fourth branch line. The first branch line includes a first conductor pattern disposed in a first conductor layer. The second branch line includes a second conductor pattern disposed in the first conductor layer. The third branch line includes a third conductor pattern disposed in a second conductor layer. The fourth branch line includes a fourth conductor pattern disposed in the second conductor layer.

20 Claims, 11 Drawing Sheets

(56) References Cited

U.S. PATENT DOCUMENTS

| | | |
|---|---|---|
| 2015/0319845 A1 | 11/2015 | Numagi et al. |
| 2016/0157336 A1* | 6/2016 | Murai .................. H05K 1/0234 361/782 |
| 2018/0168039 A1 | 6/2018 | Numagi et al. |
| 2019/0357351 A1* | 11/2019 | Park ....................... H05K 1/181 |
| 2021/0407915 A1* | 12/2021 | Contreras ........... H01L 23/5386 |

* cited by examiner

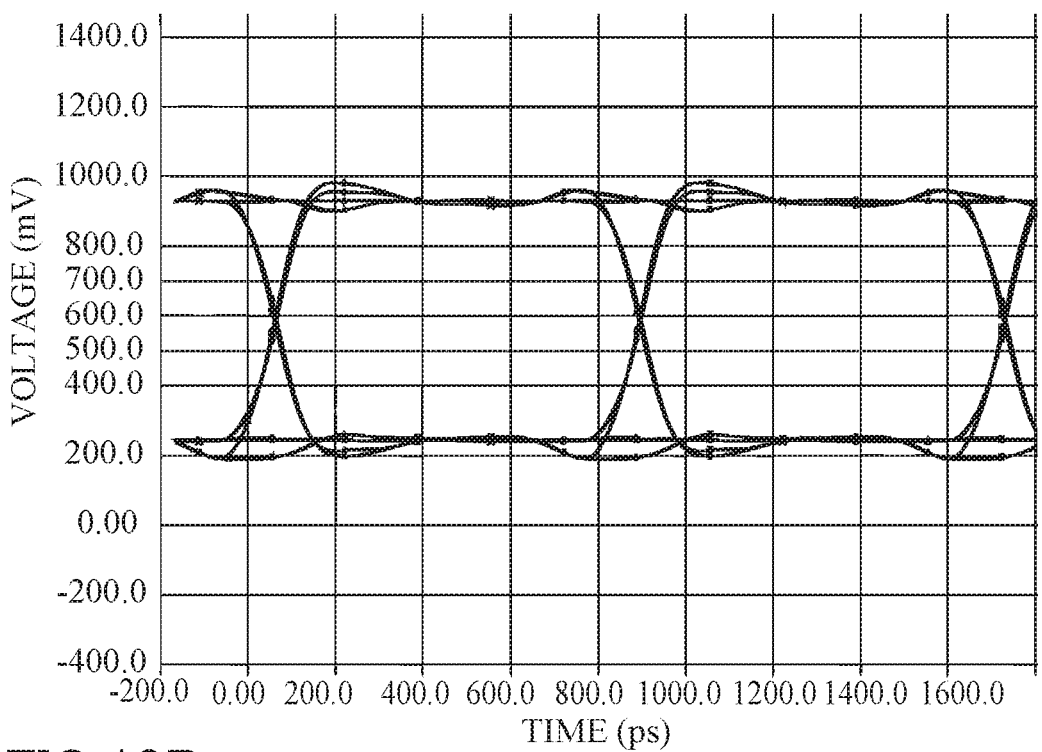
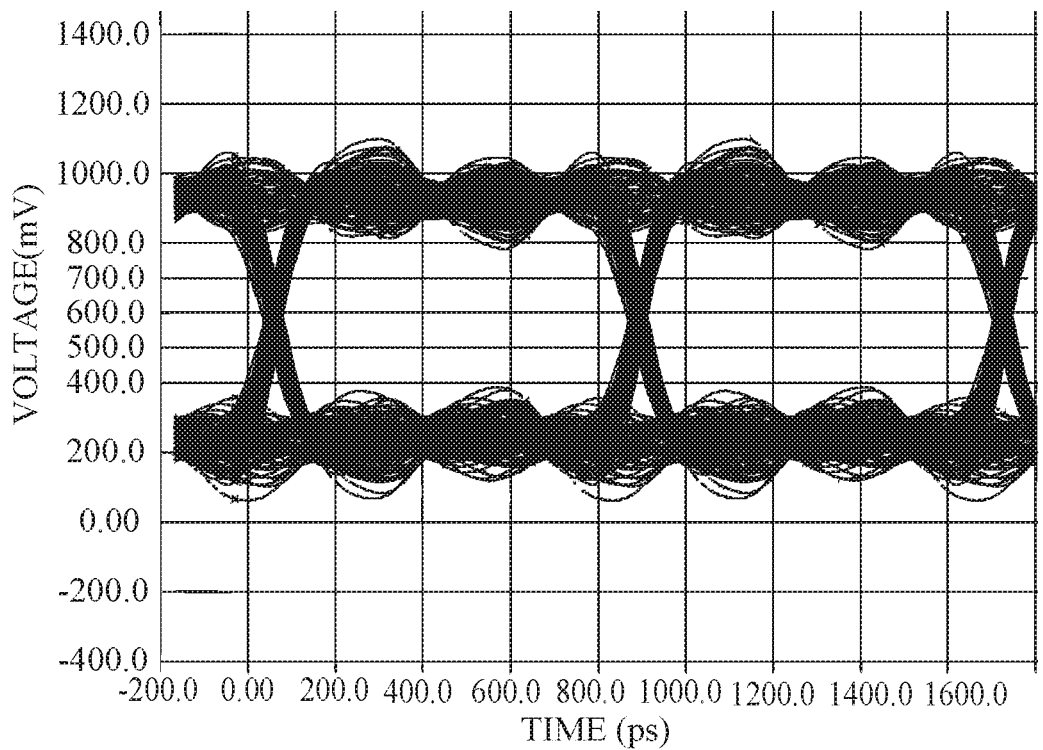

FIG.11A  501, 503, 504, 506
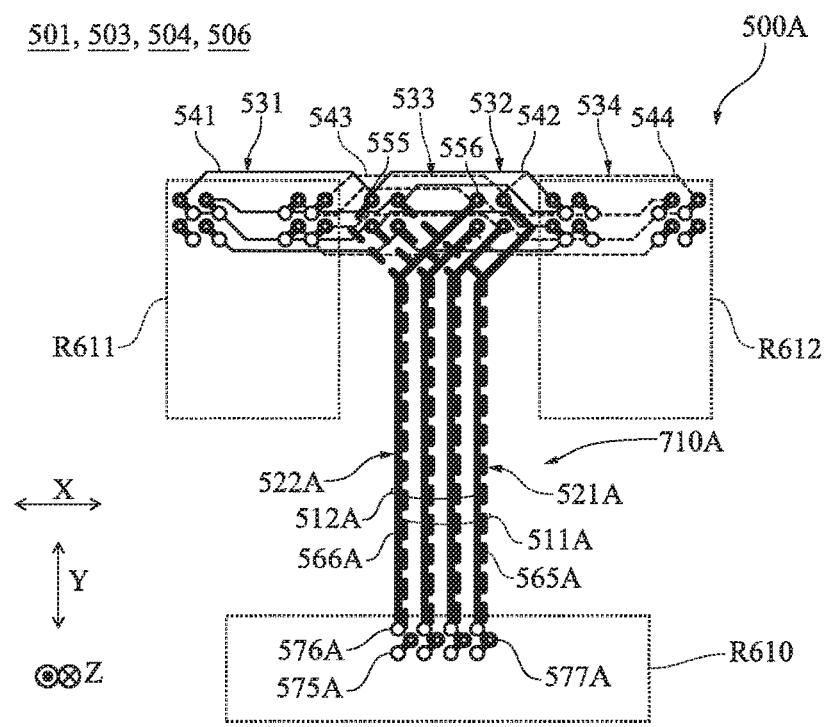
FIG.11B
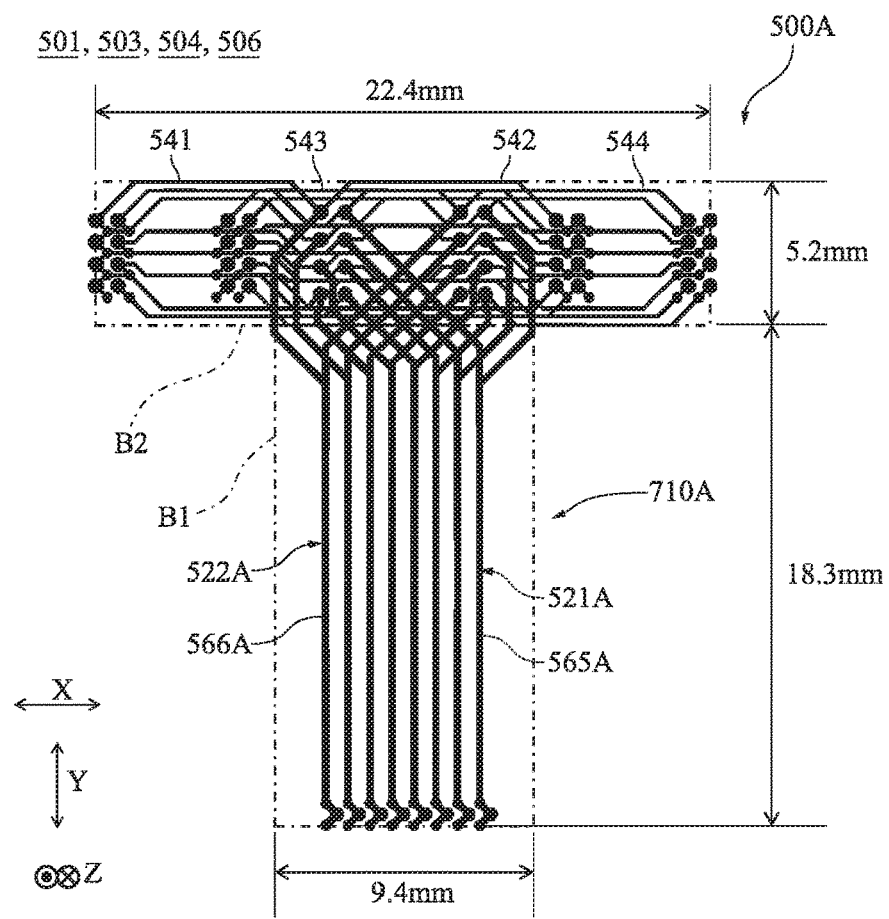

PRINTED CIRCUIT BOARD, PRINTED WIRING BOARD, ELECTRONIC DEVICE, AND IMAGE FORMING APPARATUS

BACKGROUND OF THE INVENTION

Field of the Invention

The present invention relates to technique of wiring in a printed wiring board.

Description of the Related Art

A memory system serving as an example of a printed circuit board includes a memory controller serving as an example of an element having a plurality of transmission terminals, a memory device serving as an example of an element having a plurality of reception terminals, and a printed wiring board on which these elements are mounted.

The transmission terminals of the memory controller and the reception terminals of the memory device are electrically interconnected by bus wiring of the printed wiring board. The memory controller controls the memory device by transmitting address signals and command signals to the memory device via the bus wiring.

In addition, the memory controller and the memory device have data terminals for communicating data signals, and data terminals of the memory controller and data terminals of the memory device are electrically interconnected by data signal lines of the printed wiring board.

In a highly functional electronic device, a large amount of data needs to be processed. An electronic device disclosed in Japanese Patent Laid-Open No. 2008-171950 includes two memory devices to enable processing a large amount of data. The two memory devices disclosed in Japanese Patent Laid-Open No. 2008-171950 are electrically interconnected by bus wiring branched into a T shape.

However, in a conventional printed wiring board, each of a plurality of wires constituting the bus wiring is configured in the same manner, and these wires are arranged in a plurality of lines. This leads to increase in the size of the printed wiring board, and there has been a demand for miniaturizing the printed wiring board.

SUMMARY OF THE INVENTION

According to a first aspect of the present invention, a printed circuit board includes a printed wiring board, and a first element and a second element mounted on the printed wiring board with an interval therebetween in a predetermined direction in a plan view. The printed wiring board includes a plurality of first signal lines and a plurality of second signal lines serving as transmission paths for signals transmitted to the first element and the second element. The plurality of first signal lines each include a first main line, a first branch line branching from the first main line and extending to a position overlapping with the first element in the plan view, and a second branch line branching from the first main line and extending to a position overlapping with the second element in the plan view. The plurality of second signal lines each include a second main line, a third branch line branching from the second main line and extending to a position overlapping with the first element in the plan view, and a fourth branch line branching from the second main line and extending to a position overlapping with the second element in the plan view. The first branch line includes a first conductor pattern disposed in a first conductor layer of the printed wiring board and branching from the first main line. The second branch line includes a second conductor pattern disposed in the first conductor layer and branching from the first main line. The third branch line includes a third conductor pattern disposed in a second conductor layer of the printed wiring board and branching from the second main line. The fourth branch line includes a fourth conductor pattern disposed in the second conductor layer and branching from the second main line.

According to a second aspect of the present invention, a printed wiring board includes a plurality of first signal lines and a plurality of second signal lines serving as transmission paths for signals transmitted to a first element and a second element. The first element and the second element are respectively mountable in a first mounting region and a second mounting region of the printed wiring board. An interval is provided between the first mounting region and the second mounting region in a predetermined direction in a plan view. The plurality of first signal lines each include a first main line, a first branch line branching from the first main line and extending to a position overlapping with the first mounting region in the plan view, and a second branch line branching from the first main line and extending to a position overlapping with the second mounting region in the plan view. The plurality of second signal line each include a second main line, a third branch line branching from the second main line and extending to a position overlapping with the first mounting region in the plan view, and a fourth branch line branching from the second main line and extending to a position overlapping with the second mounting region in the plan view. The first branch line includes a first conductor pattern disposed in a first conductor layer of the printed wiring board and branching from the first main line. The second branch line includes a second conductor pattern disposed in the first conductor layer and branching from the first main line. The third branch line includes a third conductor pattern disposed in a second conductor layer of the printed wiring board and branching from the second main line. The fourth branch line includes a fourth conductor pattern disposed in the second conductor layer and branching from the second main line.

Further features of the present invention will become apparent from the following description of exemplary embodiments with reference to the attached drawings.

BRIEF DESCRIPTION OF THE DRAWINGS

FIG. 10A is a graph illustrating a result of observation of a waveform of a signal in Example 2.

FIG. 10B is a graph illustrating a result of observation of a waveform of a signal in Example 2.

FIG. 11A is a schematic plan view of address/command signal lines according to a second exemplary embodiment.

FIG. 11B is a plan view of address/command signal lines of Example 3.

DESCRIPTION OF THE EMBODIMENTS

Exemplary embodiments of the present invention will be described in detail below with reference to drawings.

First Exemplary Embodiment

Figure 1A:
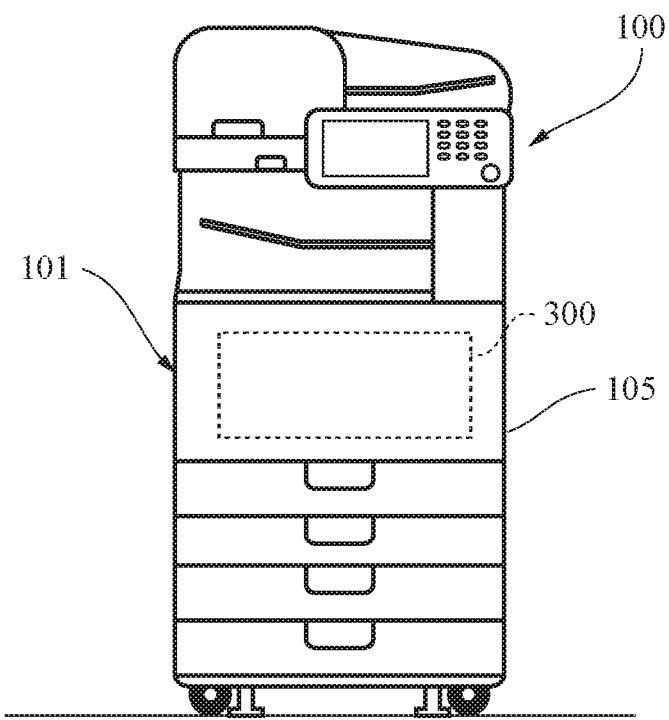
FIG. 1A is a front view of an image forming apparatus serving as an example of an electronic device according to a first exemplary embodiment.
Figure 1B:
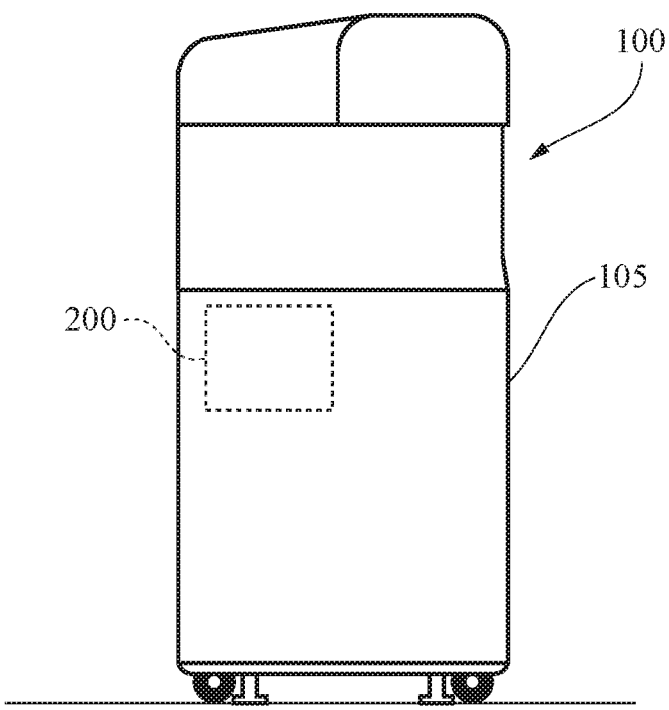
FIG. 1B is a back view of the image forming apparatus according to the first exemplary embodiment.

FIG. 1A is a front view of an image forming apparatus serving as an example of an electronic device according to the first exemplary embodiment. FIG. 1B is a back view of the image forming apparatus. An image forming apparatus 100 is a digital device of an electrophotographic system such as a printer, a copier, a facsimile machine, or a multifunctional apparatus. The image forming apparatus 100 includes an apparatus main unit 101 that forms an image on a sheet, a control module 200 that controls the apparatus main unit 101, and a casing 105. The control module 200 is provided in a rear portion of the apparatus main unit 101, and is disposed inside the casing 105 together with the apparatus main unit 101. The apparatus main unit 101 includes an image forming portion 300 that forms an image on a sheet, and an unillustrated sheet conveyance mechanism. The image forming portion 300 includes a photosensitive drum, a charging portion, a developing portion, a transfer portion, a fixing portion, and so forth, which are not illustrated.

The control module 200 is an electronic module as a printed circuit board. The control module 200 receives image data from an external apparatus through an interface such as a local area network: LAN or a universal serial bus: USB. In addition, the control module 200 processes the received image data, transmits the processed image data to the apparatus main unit 101, and controls the apparatus main unit 101 to form an image on a sheet.

Figure 2:
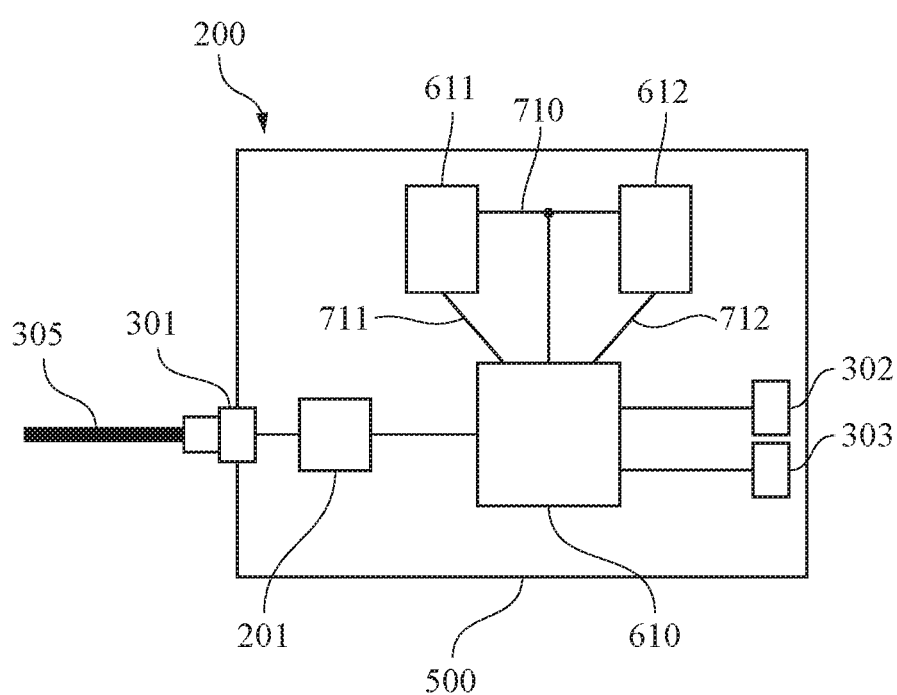
FIG. 2 is an explanatory diagram of a control module according to the first exemplary embodiment.

FIG. 2 is an explanatory diagram of the control module 200 according to the first exemplary embodiment. The control module 200 includes a memory device 611 serving as an example of a first element, a memory device 612 serving as an example of a second element, and a memory controller 610 serving as an example of a third element. In addition, the control module 200 includes connectors 301, 302, and 303, a conversion chip 201, and a printed wiring board 500. The memory devices 611 and 612, the memory controller 610, the connectors 301 to 303, and the conversion chip 201 are mounted on the printed wiring board 500. The printed wiring board 500 is a rigid board.

The memory devices 611 and 612 are memory devices of the same kind. For example, the memory devices 611 and 612 are both memories of double data rate 4: DDR4. A LAN cable 305 is connected to the connector 301, and image data is received from an external device through the LAN cable 305. The conversion chip 201 processes the image data received through the connector 301 and outputs the processed image data to the memory controller 610. The memory controller 610 stores image data in the memory devices 611 and 612, and reads image data stored in the memory devices 611 and 612. The memory controller 610 outputs image data to the connectors 302 and 303, and transmits the image data to the image forming portion 300 illustrated in FIG. 1A and connected to the connectors 302 and 303 via unillustrated cables.

The memory controller 610 and the memory devices 611 and 612 are each constituted by one semiconductor package. The memory devices 611 and 612 are respectively electrically connected to the memory controller 610 via data signal lines 711 and 712 of the printed wiring board 500 serving as transmission paths for data signals representing image data. The data signal lines 711 and 712 are each bus wiring constituted by a plurality of lines.

Further, the memory controller 610 and the memory devices 611 and 612 are electrically connected to address/command signal lines 710 of the printed wiring board 500 serving as transmission paths for address signals and command signals. The address/command signal lines 710 are bus wiring constituted by a plurality of signal lines. The memory controller 610 transmits address signals and command signals to the two memory devices 611 and 612 via the address/command signal lines 710 by a parallel transmission system. An address signal and a command signal that are parallel signals transmitted from the memory controller 610 are received by both of the two memory devices 611 and 612 through the address/command signal lines 710. The memory controller 610 controls the memory devices 611 and 612 by transmitting address signals and command signals to the memory devices 611 and 612 through the address/command signal lines 710. The memory devices 611 and 612 each perform processing such as recording and deletion of data in accordance with the address signals and command signals. The memory controller 610, the memory devices 611 and 612, and the printed wiring board 500 constitute a memory system.

Figure 3:
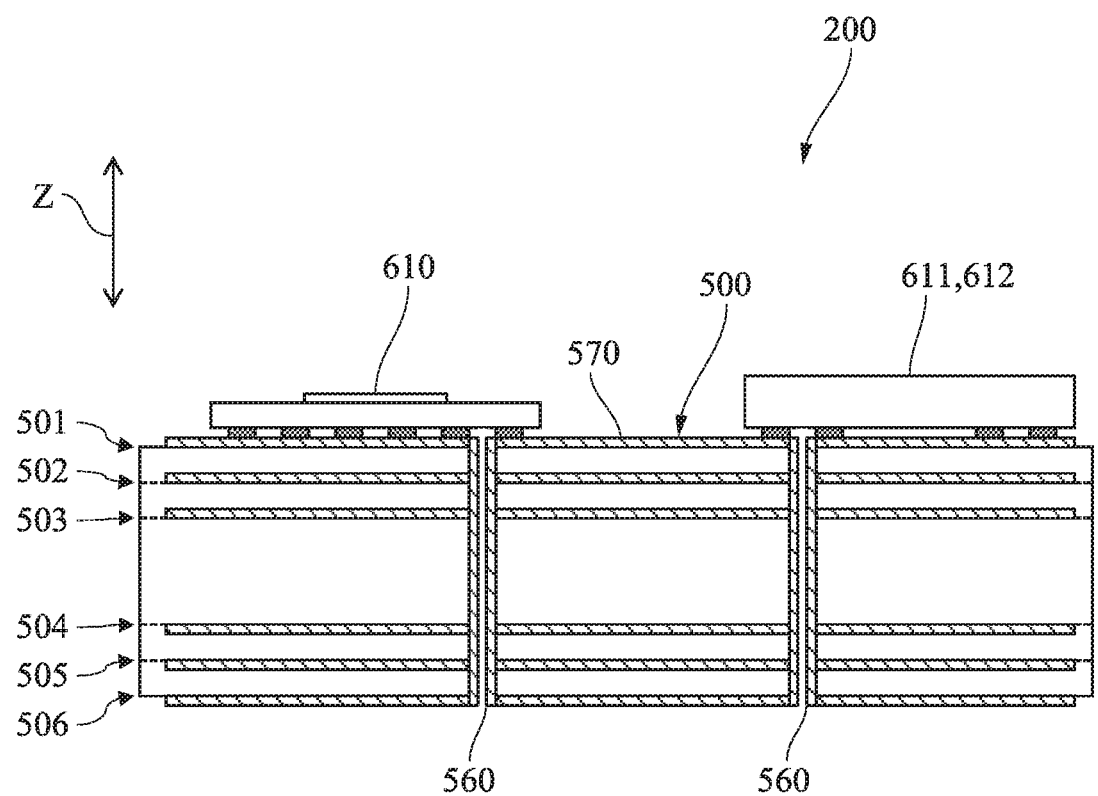
FIG. 3 is a section view of the control module according to the first exemplary embodiment.

FIG. 3 is a section view of the control module 200 according to the first exemplary embodiment. The printed wiring board 500 includes an insulating substrate and a conductor that is electrically conductive and constitutes wiring. The wiring is provided on the substrate. For example, the material of the substrate is an epoxy resin. For example, the material of the conductor is copper.

The printed wiring board 500 is a multilayer substrate including a plurality of conductor layers, for example, six conductor layers 501, 502, 503, 504, 505, and 506. The conductor layers 501 to 506 are arranged in a Z direction, which is a lamination direction perpendicular to a main surface of the printed wiring board 500, with intervals therebetween. To be noted, a substrate, that is, an insulating layer is provided between every two adjacent conductor layers among the conductor layers 501 to 506. The conductor layers 501 to 506 are arranged in the order of the conductor layer 501, the conductor layer 502, the conductor layer 503, the conductor layer 504, the conductor layer 505, and the conductor layer 506 from one side to the other side in the Z direction. The conductor layers 501 and 506 are surface layers serving as main surfaces, that is, mounting surfaces. The conductor layers 502 to 505 arranged between the conductor layers 501 and 506 are inner layers. To be noted, unillustrated solder resist may be disposed on the conductor layers 501 and 506.

A conductor pattern 570 constituting wiring is disposed in each of the conductor layers 501 and 506. Via conductors 560 each constituting wiring are disposed to penetrate through the conductor layers 501 to 506. A via conductor 560 is a conductor formed in a via of substrates. In the first exemplary embodiment, the via is a through hole, that is, a through via, and the via conductor 560 is provided in a through hole.

To be noted, the data signal lines 711 and 712 and the address/command signal lines 710 illustrated in FIG. 2 are not precisely illustrated in FIG. 3. In FIG. 3, a section of the printed wiring board 500 is schematically illustrated for describing the conductor layers 501 to 506.

The memory controller 610, and the memory devices 611 and 612 are all mounted on the conductor layer 501 among the conductor layers 501 and 506, which are a pair of surface layers. To be noted, although it is preferable that the two memory devices 611 and 612 are both mounted on the conductor layer 501, a configuration in which one of the memory devices 611 and 612 is mounted on the conductor layer 501 and the other is mounted on the conductor layer 506 may be employed. In addition, although it is preferable that the memory controller 610 is mounted on the conductor layer 501 on which the two memory devices 611 and 612 are mounted, the memory controller 610 may be mounted on the conductor layer 506.

Unillustrated components such as capacitors and resistors are mounted on the conductor layers 501 and 506. Conductor patterns mainly serving as grounding are disposed in the conductor layers 502 and 505. The conductor layer 501 serves as a third conductor layer, the conductor layer 503 serves as a first conductor layer, and the conductor layer 504 serves as a second conductor layer. The conductor layer 503 is relatively close to the conductor layer 501 as compared with the conductor layer 504. Conductor patterns serving as part of the data signal lines 711 and 712 and the address/command signal lines 710 illustrated in FIG. 2 are mainly disposed in the conductor layers 503 and 504.

The memory controller 610 and the memory devices 611 and 612 are bonded to the printed wiring board 500 with solder. The memory controller 610 and the memory devices 611 and 612 each include a plurality of signal terminals, a plurality of power terminals, and a plurality of ground terminals. Sixteen of the plurality of signal terminals are data terminals. The structure of the terminals of the memory controller 610 and the memory devices 611 and 612 is a ball grid array: BGA.

Figure 4:
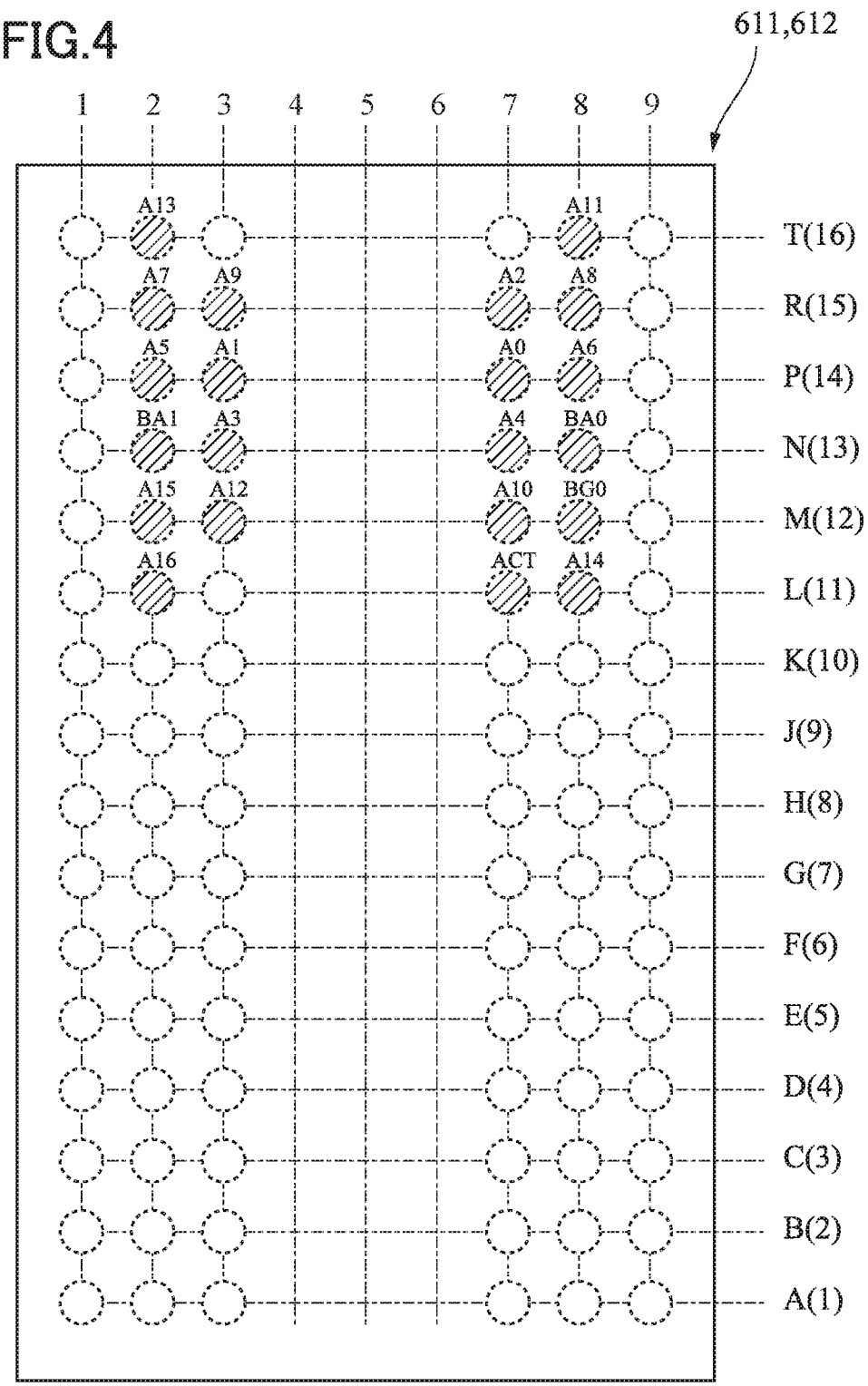
FIG. 4 is a plan view of a memory device according to the first exemplary embodiment.

FIG. 4 illustrates arrangement of terminals in the memory devices 611 and 612. FIG. 4 is a plan view of the memory devices 611 and 612. FIG. 4 illustrates the memory devices 611 and 612 as viewed from the side opposite to the side on which the terminals are arranged. In FIG. 4, each terminal is indicated by a broken line, which is a hidden line.

The memory devices 611 and 612 are each a DDR4-synchronous dynamic random access memory: DDR4-SDRAM. As illustrated in FIG. 4, the terminals are provided in the first to third columns and seventh to ninth columns among 16 rows×9 columns. No terminal is provided in the fourth to sixth columns. The total number of terminals is 96. In FIG. 4, terminals indicated with hatching among the plurality of signal terminals are address/command terminals A0 to A16, BA0, BA1, BG0, and ACT. The address/command terminals A0 to A16, BA0, BA1, BG0, and ACT are disposed in the eleventh to sixteenth rows and second to eighth columns.

Incidentally, the address/command signal lines 710 illustrated in FIG. 2 are constituted by a plurality of signal lines, and each of the plurality of signal lines has a so-called T-branched wiring structure. That is, each signal line includes a main line and two branch lines. The input impedance of an unillustrated address/command circuit included in each of the memory devices 611 and 612 and connected to the branch line is high. Therefore, when an address/command signal having a pulse waveform reaches an input portion of the address/command circuit, a reflected wave is generated. In wiring of a T-branched structure, the difference between the lengths of the two branch lines affects the quality of the waveform of the signal. In the case where the difference between the wire lengths of the two branch lines exceeds a predetermined value, the noise derived from multiple reflection of signal waveform is large in high-speed signal transmission. When the disturbance of the signal waveform exceeds a predetermined threshold value, the risk of failure in logical judgement in a memory device increases. Failure in logical judgement can cause image noises and malfunction of electronic devices.

Generally, the width of wire used for a signal line of a build-up via substrate is 50 μm to 100 μm. The wire width of a semiconductor package substrate is even smaller. In a substrate such as a build-up via substrate or a semiconductor package substrate suitable for densely-arranged wiring, the area of the wiring is not likely to be large even in the case where part of branch lines meander to reduce the difference between the wire lengths of two branch lines to suppress disturbance of signal waveform.

In contrast, in the first exemplary embodiment, the printed wiring board 500 is a through via substrate as illustrated in FIG. 3. Therefore, manufacture of the printed wiring board 500 is easy, the productivity of the printed wiring board 500 is high and the production cost thereof is low. In a through via substrate, the wire width of a signal line is 75 μm to 250 μm. If the signal lines meander, the wiring area thereof is larger than that of a build-up via substrate or a semiconductor package substrate. Generally, the insulating layers of a through via substrate are thicker than those of a build-up via substrate or a semiconductor package substrate. In an example, the thickness of an insulating layer of a build-up substrate is about 60 μm, and that of a through via substrate is 100 μm. In a signal line through which a high-speed electric signal is transmitted, the wiring pitch within the meandering signal line is configured such that electromagnetic coupling within itself is small to suppress self crosstalk of the signal line. Since the wiring pitch within a meandering signal line need to be large with respect to the distance to a grounding layer disposed with an insulating layer therebetween, the wiring area becomes large. Therefore, the wiring area needs to be larger in a through via substrate than in a build-up substrate or a semiconductor package substrate. For example, in the case where the wiring pitch within the meandering signal line is three times larger than the distance to the grounding layer, the wiring pitch is 180 μm in a build-up substrate, and 300 μm in a through via substrate.

In the first exemplary embodiment, a through via from which two branch lines branch is provided at a position in an equal distance from each terminal of the two memory devices 611 and 612 so as to reduce or eliminate meandering wires. A land diameter of a via conductor formed in a through via is 500 μm to 600 μm, which is larger than the wire width. Therefore, in the first exemplary embodiment, the wiring area occupied by the address/command signal lines 710 illustrated in FIG. 2 in a plan view as viewed in the Z direction is reduced by skillfully designing the wiring structure of the address/command signal lines 710, and thus the printed wiring board 500 is miniaturized. The wiring structure of the address/command signal lines 710 will be described in detail below.

Figure 5:
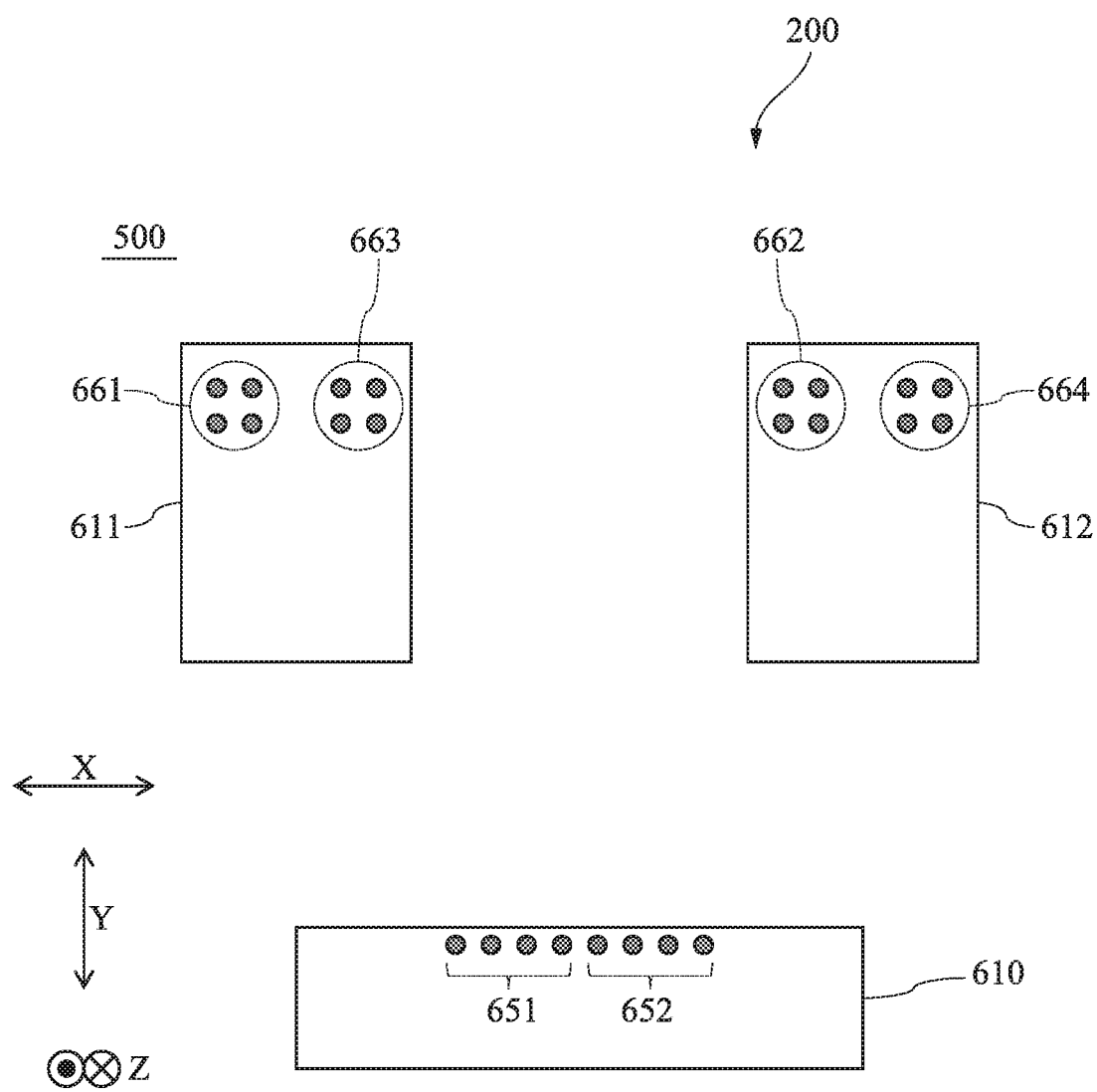
FIG. 5 is a schematic plan view of a memory controller and the memory device according to the first exemplary embodiment.

FIG. 5 is a schematic plan view of the memory controller 610 and the memory devices 611 and 612 illustrating the control module 200 according to the first exemplary embodiment in a plan view, that is, as viewed in the Z direction. As illustrated in FIG. 5, the memory devices 611 and 612 are arranged on the printed wiring board 500 with an interval therebetween in an X direction perpendicular to the Z direction and serving as a predetermined direction. In addition, the memory controller 610 is disposed on the printed wiring board 500 with an interval from the memory devices 611 and 612 in a Y direction perpendicular to the X direction and the Z direction.

As illustrated in FIG. 4, the address/command terminals A0 to A16, BA0, BA1, BG0, and ACT are disposed in the second, third, seventh, and eighth columns. Therefore, the address/command terminals A0 to A16, BA0, BA1, BG0, and ACT can be divided into two groups. Hereinafter, description will be given focusing on the four address/command terminals A1, A5, A7, and A9, and the four address/command terminals A0, A2, A6, and A8 illustrated in FIG. 4 for simpler description.

As illustrated in FIG. 5, the memory device 611 includes a group of a plurality of terminals 661 that are address/command terminals disposed in the second and third columns of FIG. 4 and a group of a plurality of terminals 663 that are address/command terminals disposed in the seventh and eighth columns of FIG. 4. Similarly, as illustrated in FIG. 5, the memory device 612 includes a group of a plurality of terminals 662 that are address/command terminals disposed in the second and third columns of FIG. 4 and a group of a plurality of terminals 664 that are address/command terminals disposed in the seventh and eighth columns of FIG. 4. The number of terminals in each of these four groups is four. The plurality of terminals 661 each serve as a first reception terminal. The plurality of terminals 662 each serve as a second reception terminal. The plurality of terminals 663 each serve as a third reception terminal. The plurality of terminals 664 each serve as a fourth reception terminal.

The memory controller 610 includes a plurality of terminals 651 that are address/command terminals. In addition, the memory controller 610 includes a plurality of terminals 652 that are address/command terminals. Also in the memory controller 610, the terminals can be divided into a group of the plurality of terminals 651 and a group of the plurality of terminals 652. The number of terminals in each of these two groups is four. The plurality of terminals 651 each serve as a first transmission terminal. The plurality of terminals 652 each serve as a second transmission terminal.

As described above, FIG. 5 illustrates eight address/command terminals of each of the memory controller 610 and the memory devices 611 and 612. Therefore, in the example of FIG. 5, the memory controller 610 is capable of transmitting eight signals in parallel as address signals and command signals. In addition, in the example of FIG. 5, the memory devices 611 and 612 are each capable of receiving eight signals in parallel as address signals and command signals. In FIG. 5, illustration of terminals other than the terminals 651 and 652 in the memory controller 610 and illustration of terminals other than the terminals 661 to 664 in the memory devices 611 and 612 are omitted. To be noted, the number of transmission terminals of the memory controller 610, the number of reception terminals of the memory device 611, and the number of reception terminals of the memory device 612 are each not limited to eight.

Figure 6A:
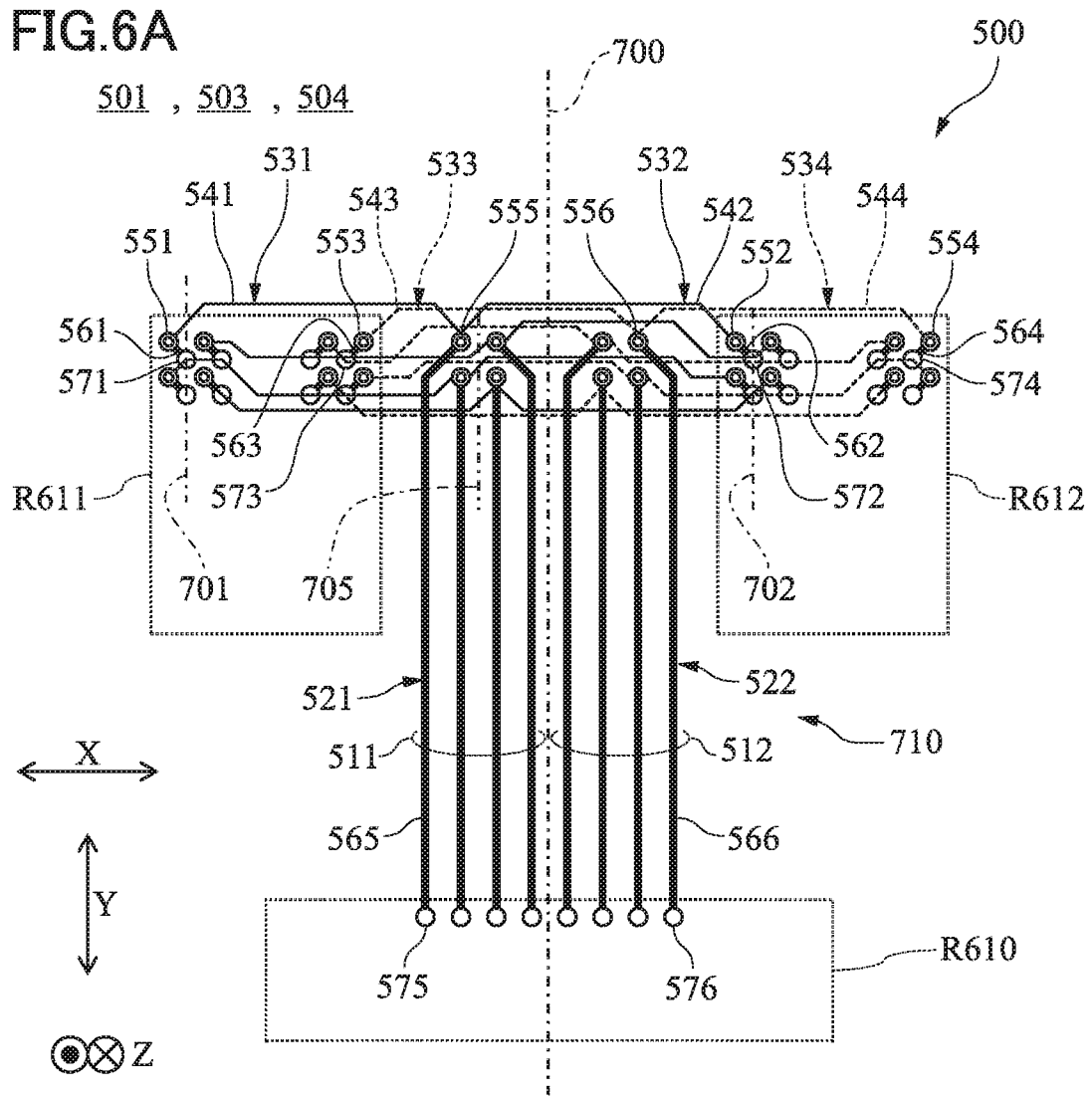
FIG. 6A is a schematic plan view of address/command signal lines according to the first exemplary embodiment.

FIG. 6A is a plan view of the control module 200 according to the first exemplary embodiment as viewed in the Z direction schematically illustrating the address/command signal lines 710 of the printed wiring board 500. FIG. 6A schematically illustrates wiring of the conductor layer 501, the conductor layer 503, and the conductor layer 504. In FIG. 6A, conductor patterns disposed in the conductor layer 501 are indicated by thick solid lines, conductor patterns disposed in the conductor layer 503 are indicated by thin solid lines, and conductor patterns disposed in the conductor layer 504 are indicated by thin broken lines. In addition, in FIG. 6A, a region where the memory controller 610 of FIG. 5 can be mounted is denoted by R610, a region where the memory device 611 of FIG. 5 can be mounted is denoted by R611, and a region where the memory device 612 of FIG. 5 can be mounted is denoted by R612. The region R611 serves as a first mounting region, and the region R612 serves as a second mounting region. The region R610 is a region where the memory controller 610 is projected onto the printed wiring board 500 in the Z direction. The region R611 is a region where the memory device 611 is projected onto the printed wiring board 500 in the Z direction. The region R612 is a region where the memory device 612 is projected onto the printed wiring board 500 in the Z direction. Therefore, the outer shape of the region R610 is the same as that of the memory controller 610, the outer shape of the region R611 is the same as that of the memory device 611, and the outer shape of the region R612 is the same as that of the memory device 612.

The printed wiring board 500 includes a plurality of signal lines 511 serving as first signal lines that electrically interconnect the terminals 651, 661, and 662 illustrated in FIG. 5. In the first exemplary embodiment, four signal lines 511 are provided. The printed wiring board 500 includes a plurality of signal lines 512 serving as second signal lines that electrically interconnect the terminals 652, 663, and 664 illustrated in FIG. 5. In the first exemplary embodiment, four signal lines 512 are provided. These eight signal lines 511 and 512 constitute a transmission path for transmitting address signals and command signals, which are parallel signals, that is, constitute the address/command signal lines 710 serving as bus wiring. To be noted, the number of lines constituting the address/command signal lines 710 is not limited to eight. The number of lines constituting the address/command signal lines 710 may be set to correspond to the number of transmission terminals of the memory controller 610, that is, the number of reception terminals of each of the memory devices 611 and 612.

The signal lines 511 and 512 are wires having T-branched structures. One signal line 511 is a wire for transmitting signals representing the same information from the memory controller 610 to the memory devices 611 and 612. Similarly, one signal line 512 is a wire for transmitting signals representing the same information from the memory controller 610 to the memory devices 611 and 612. Each signal line 511 includes a main line 521 serving as a first main line, a branch line 531 serving as a first branch line branching from the main line 521, and a branch line 532 serving as a second branch line branching from the main line 521. Each signal line 512 includes a main line 522 serving as a second main line, a branch line 533 serving as a third branch line branching from the main line 522, and a branch line 534 serving as a fourth branch line branching from the main line 522.

The branch line 531 extends in the X direction from the main line 521 to a position overlapping with the memory device 611 of FIG. 5, that is, to a position overlapping with the region R611 of FIG. 6A as viewed in the Z direction. The branch line 532 extends in the X direction from the main line 521 to a position overlapping with the memory device 612 of FIG. 5, that is, to a position overlapping with the region R612 of FIG. 6A as viewed in the Z direction. The branch line 533 extends in the X direction from the main line 522 to a position overlapping with the memory device 611 of FIG. 5, that is, to a position overlapping with the region R611 of FIG. 6A as viewed in the Z direction. The branch line 534 extends in the X direction from the main line 522 to a position overlapping with the memory device 612 of FIG. 5, that is, to a position overlapping with the region R612 of FIG. 6A as viewed in the Z direction.

The main line 521 includes a land 575 and a conductor pattern 565 serving as a fifth conductor pattern that are disposed in the conductor layer 501. In addition, the main line 521 includes a via conductor 555 serving as a fifth via conductor provided in a through hole that is a through via. The two branch lines 531 and 532 branch from the via conductor 555. The land 575 is disposed at a position overlapping with the memory controller 610 of FIG. 5, that is, a position overlapping with the region R610 of FIG. 6A as viewed in the Z direction. The land 575 is connected to a terminal 651 illustrated in FIG. 5. The via conductor 555 is disposed between the memory devices 611 and 612 illustrated in FIG. 5 in the X direction, that is, between the regions R611 and R612 illustrated in FIG. 6A in the X direction. The conductor pattern 565 is formed to extend from the via conductor 555 to the land 575 in the Y direction as viewed in the Z direction. The land 575 and the via conductor 555 are electrically interconnected by the conductor pattern 565.

The branch line 531 includes a conductor pattern 541 serving as a first conductor pattern disposed in the conductor layer 503, and a via conductor 551 serving as a first via conductor provided in a through hole that is a through via. In addition, the branch line 531 includes a conductor pattern 561 and a land 571 that are disposed in the conductor layer 501. The land 571 is disposed at a position overlapping with the memory device 611 of FIG. 5, that is, a position overlapping with the region R611 of FIG. 6A as viewed in the Z direction. The land 571 is connected to a terminal 661 illustrated in FIG. 5. The via conductor 551 is disposed at a position overlapping with the memory device 611 of FIG. 5, that is, a position overlapping with the region R611 of FIG. 6A as viewed in the Z direction. The conductor pattern 541 is formed to branch from the via conductor 555 and extend to the via conductor 551. The via conductors 555 and 551 are electrically interconnected by the conductor pattern 541. The via conductor 551 and the land 571 are electrically interconnected by the conductor pattern 561.

The branch line 532 includes a conductor pattern 542 serving as a second conductor pattern disposed in the conductor layer 503, and a via conductor 552 serving as a second via conductor provided in a through hole that is a through via. In addition, the branch line 532 includes a conductor pattern 562 and a land 572 that are disposed in the conductor layer 501. The land 572 is disposed at a position overlapping with the memory device 612 of FIG. 5, that is, a position overlapping with the region R612 of FIG. 6A as viewed in the Z direction. The land 572 is connected to a terminal 662 illustrated in FIG. 5. The via conductor 552 is disposed at a position overlapping with the memory device 612 of FIG. 5, that is, a position overlapping with the region R612 of FIG. 6A as viewed in the Z direction. The conductor pattern 542 is formed to branch from the via conductor 555 and extend to the via conductor 552. The via conductors 555 and 552 are electrically interconnected by the conductor pattern 542. The via conductor 552 and the land 572 are electrically interconnected by the conductor pattern 562.

The main line 522 includes a land 576 and a conductor pattern 566 serving as a sixth conductor pattern that are disposed in the conductor layer 501. In addition, the main line 522 includes a via conductor 556 serving as a sixth via conductor provided in a through hole that is a through via. The two branch lines 533 and 534 branch from the via conductor 556. The land 576 is disposed at a position overlapping with the memory controller 610 of FIG. 5, that is, a position overlapping with the region R610 of FIG. 6A as viewed in the Z direction. The land 576 is connected to a terminal 652 illustrated in FIG. 5. The via conductor 556 is disposed between the memory devices 611 and 612 illustrated in FIG. 5 in the X direction, that is, between the regions R611 and R612 illustrated in FIG. 6A in the X direction. The conductor pattern 566 is formed to extend from the via conductor 556 to the land 576 in the Y direction as viewed in the Z direction. The land 576 and the via conductor 556 are electrically interconnected by the conductor pattern 566.

The branch line 533 includes a conductor pattern 543 serving as a third conductor pattern disposed in the conductor layer 504, and a via conductor 553 serving as a third via conductor provided in a through hole that is a through via. In addition, the branch line 533 includes a conductor pattern 563 and a land 573 that are disposed in the conductor layer 501. The land 573 is disposed at a position overlapping with the memory device 611 of FIG. 5, that is, a position overlapping with the region R611 of FIG. 6A as viewed in the Z direction. The land 573 is connected to a terminal 663 illustrated in FIG. 5. The via conductor 553 is disposed at a position overlapping with the memory device 611 of FIG. 5, that is, a position overlapping with the region R611 of FIG. 6A as viewed in the Z direction. The conductor pattern 543 is formed to branch from the via conductor 556 and extend to the via conductor 553. The via conductors 556 and 553 are electrically interconnected by the conductor pattern 543. The via conductor 553 and the land 573 are electrically interconnected by the conductor pattern 563.

The branch line 534 includes a conductor pattern 544 serving as a fourth conductor pattern disposed in the conductor layer 504, and a via conductor 554 serving as a fourth via conductor provided in a through hole that is a through via. In addition, the branch line 534 includes a conductor pattern 564 and a land 574 that are disposed in the conductor layer 501. The land 574 is disposed at a position overlapping with the memory device 612 of FIG. 5, that is, a position overlapping with the region R612 of FIG. 6A as viewed in the Z direction. The land 574 is connected to a terminal 664 illustrated in FIG. 5. The via conductor 554 is disposed at a position overlapping with the memory device 612 of FIG. 5, that is, a position overlapping with the region R612 of FIG. 6A as viewed in the Z direction. The conductor pattern 544 is formed to branch from the via conductor 556 and extend to the via conductor 554. The via conductors 556 and 554 are electrically interconnected by the conductor pattern 544. The via conductor 554 and the land 574 are electrically interconnected by the conductor pattern 564.

According to the configuration described above, the starting end of the main line 521 is the land 575, and the terminal end thereof is the via conductor 555. In addition, the starting end of the main line 522 is the land 576, and the terminal end thereof is the via conductor 556. The starting end of the branch line 531 is an end of the conductor pattern 541 connected to the via conductor 555, and the terminal end thereof is the land 571. The starting end of the branch line 532 is an end of the conductor pattern 542 connected to the via conductor 555, and the terminal end thereof is the land 572. The starting end of the branch line 533 is an end of the conductor pattern 543 connected to the via conductor 556, and the terminal end thereof is the land 573. The starting end of the branch line 534 is an end of the conductor pattern 544 connected to the via conductor 556, and the terminal end thereof is the land 574. The wire widths of the conductor patterns 541 and 542 of the branch lines 531 and 532 branching from the via conductor 555 are smaller than the wire width of the conductor pattern 565 of the main line 521. Similarly, the wire widths of the conductor patterns 543 and 544 of the branch lines 533 and 534 branching from the via conductor 556 are smaller than the wire width of the conductor pattern 566 of the main line 522.

In the first exemplary embodiment, the plurality of signal lines constituting the address/command signal lines 710 are divided into the plurality of signal lines 511 and the plurality of signal lines 512. Further, since the conductor patterns 541 and 542 of the signal lines 511 are disposed in a different conductor layer from the conductor patterns 543 and 544 of the signal lines 512, the area occupied by the address/command signal lines 710 in a plan view as viewed in the Z direction can be reduced. Therefore, the printed wiring board 500 can be miniaturized, and thus the control module 200 can be miniaturized.

Figure 6B:
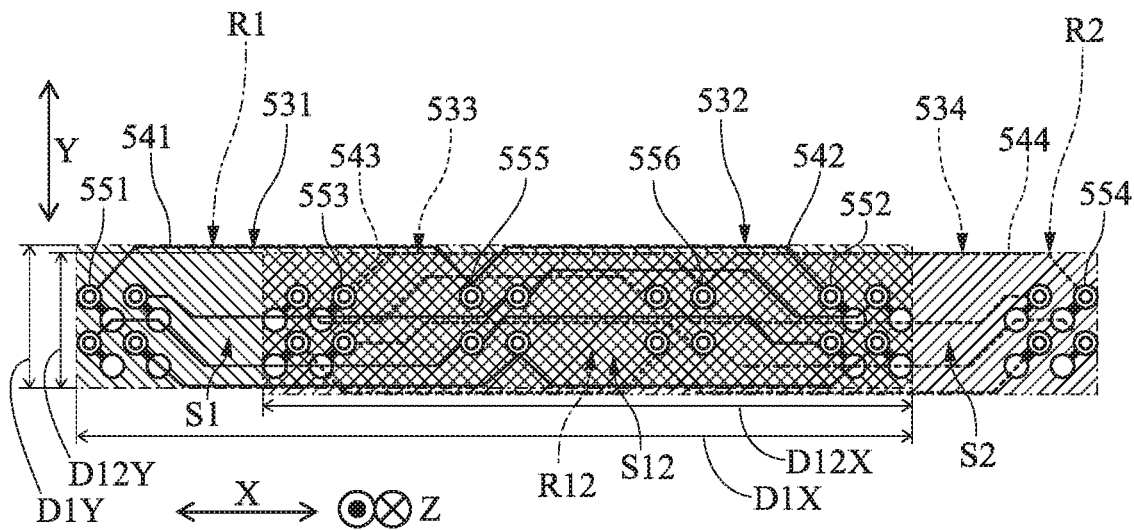
FIG. 6B is a plan view of branch lines according to the first exemplary embodiment.

FIG. 6B is a plan view of the branch lines 531 to 534 illustrated in FIG. 6A. A rectangular region of the minimum size including the four branch lines 531 and the four branch lines 532 as viewed in the Z direction, that is, a first rectangular region, is denoted by R1. A rectangular region of the minimum size including the four branch lines 533 and the four branch lines 534 as viewed in the Z direction, that is, a second rectangular region, is denoted by R2. In the first exemplary embodiment, as illustrated in FIG. 6B, the regions R1 and R2 partially overlap with each other as viewed in the Z direction. As a result of this, the area occupied by the address/command signal lines 710 can be further reduced. Therefore, the printed wiring board 500 can be effectively miniaturized, and thus the control module 200 can be effectively miniaturized. To be noted, a region where the regions R1 and R2 partially overlap with each other will be referred to as a region R12.

Here, the X direction will be referred to as a row direction, and the Y direction will be referred to as a column direction. A proportion of a length D12Y of a portion where the regions R1 and R2 overlap with each other in the Y direction to a length D1Y of the region R1 in the Y direction is preferably 50% or higher, more preferably 80% or higher, and further preferably 90% or higher. Considering the number of branch lines, it is preferable that the regions R1 and R1 are displaced from each other by an amount equal to the sum of the wire width of one line and the interval between two lines. A proportion of a length D12X of a portion where the regions R1 and R2 overlap with each other in the X direction to a length D1X of the region R1 in the X direction is preferably 50% or higher, and more preferably 75% or higher. A proportion of an area $S12=D12X \times D12Y$ of the region R12 to each of an area $S1=D1X \times D1Y$ of the region R1 and an area S2 of the region R2 is preferably 25% or higher, more preferably 50% or higher, and further preferably 70% or higher.

The via conductors 551 to 556 have the same configuration as the via conductor 560 illustrated in FIG. 3, and are each formed in a through hole, that is, in a through via. The number of each of the via conductors 551 to 556 is four. The four via conductors 551, the four via conductors 552, the four via conductors 553, the four via conductors 554, the four via conductors 555, and the four via conductors 556 are each arranged in two rows and two columns, that is, in a plurality of rows and a plurality of columns. Part of the four via conductors 551 is disposed between the four lands 571 arranged in a lattice shape. Part of the four via conductors 552 is disposed between the four lands 572 arranged in a lattice shape. Part of the four via conductors 553 is disposed between the four lands 573 arranged in a lattice shape. Part of the four via conductors 554 is disposed between the four lands 574 arranged in a lattice shape. The four via conductors 551, the four via conductors 552, the four via conductors 553, the four via conductors 554, the four via conductors 555, and the four via conductors 556 are similar to each other in terms of the arrangement thereof.

The four conductor patterns 541 are arranged between the four via conductors 553 or outside the four via conductors 553 as viewed in the Z direction such that short circuit is not formed with any of the four via conductors 553.

The four conductor patterns 542 are arranged between the four via conductors 556 or outside the four via conductors 556 as viewed in the Z direction such that short circuit is not formed with any of the four via conductors 556.

The four conductor patterns 543 are arranged between the four via conductors 555 or outside the four via conductors 555 as viewed in the Z direction such that short circuit is not formed with any of the four via conductors 555.

The four conductor patterns 544 are arranged between the four via conductors 552 or outside the four via conductors 552 as viewed in the Z direction such that short circuit is not formed with any of the four via conductors 552.

In the first exemplary embodiment, focusing on one signal line 511, the lengths of the branch lines 531 and 532 included in the signal line 511 are made equal. In addition, focusing on one signal line 512, the lengths of the branch lines 533 and 534 included in the signal line 512 are made equal. Here, the lengths of the branch lines 531 and 532 being equal means that the difference between the lengths of the branch lines 531 and 532 is equal to or smaller than a predetermined value. Similarly, the lengths of the branch lines 533 and 534 being equal means that the difference between the lengths of the branch lines 533 and 534 is equal to or smaller than a predetermined value. The predetermined value is preferably 1.6 mm.

Here, a straight line 700 indicated by a one-dot chain line in FIG. 6A is a virtual line positioned in the same distance from the memory device 611 and from the memory device 612 and extending in the Y direction. The branch lines 533 and 534 have shapes obtained by reversing the shapes of the branch lines 531 and 532 with respect to the straight line 700.

In the first exemplary embodiment, the plurality of via conductors 551, the plurality of via conductors 553, the plurality of via conductors 555, the plurality of via conductors 556, the plurality of via conductors 552, and the plurality of via conductors 554 are arranged in this order in the X direction. A virtual line extending in the Y direction and passing through the center of the plurality of via conductors 551 will be referred to as a straight line 701. A virtual line extending in the Y direction and passing through the center of the plurality of via conductors 552 will be referred to as a straight line 702. A virtual line extending in the Y direction and passing through the center between the straight lines 701 and 702 will be referred to as a straight line 705. The straight line 705 is positioned on the region R611 side with respect to the straight line 700. The plurality of via conductors 555 are arranged such that the straight line 705 passes through a space between the plurality of via conductors 555. As described above, the plurality of via conductors 555 are disposed at a center portion between the plurality of via conductors 551 and the plurality of via conductors 552 in the X direction. As a result of this, the lengths of the branch lines 531 and 532 can be made equal without meandering the conductor pattern 541 or 542.

The branch lines 533 and 534 have structures obtained by reversing the branch lines 531 and 532 with respect to the straight line 700. Therefore, the lengths of the branch lines 533 and 534 can be made equal without meandering the conductor pattern 543 or 544. As a result of this, the quality of address signals and command signals received by the memory devices 611 and 612 can be kept high.

Figure 7:
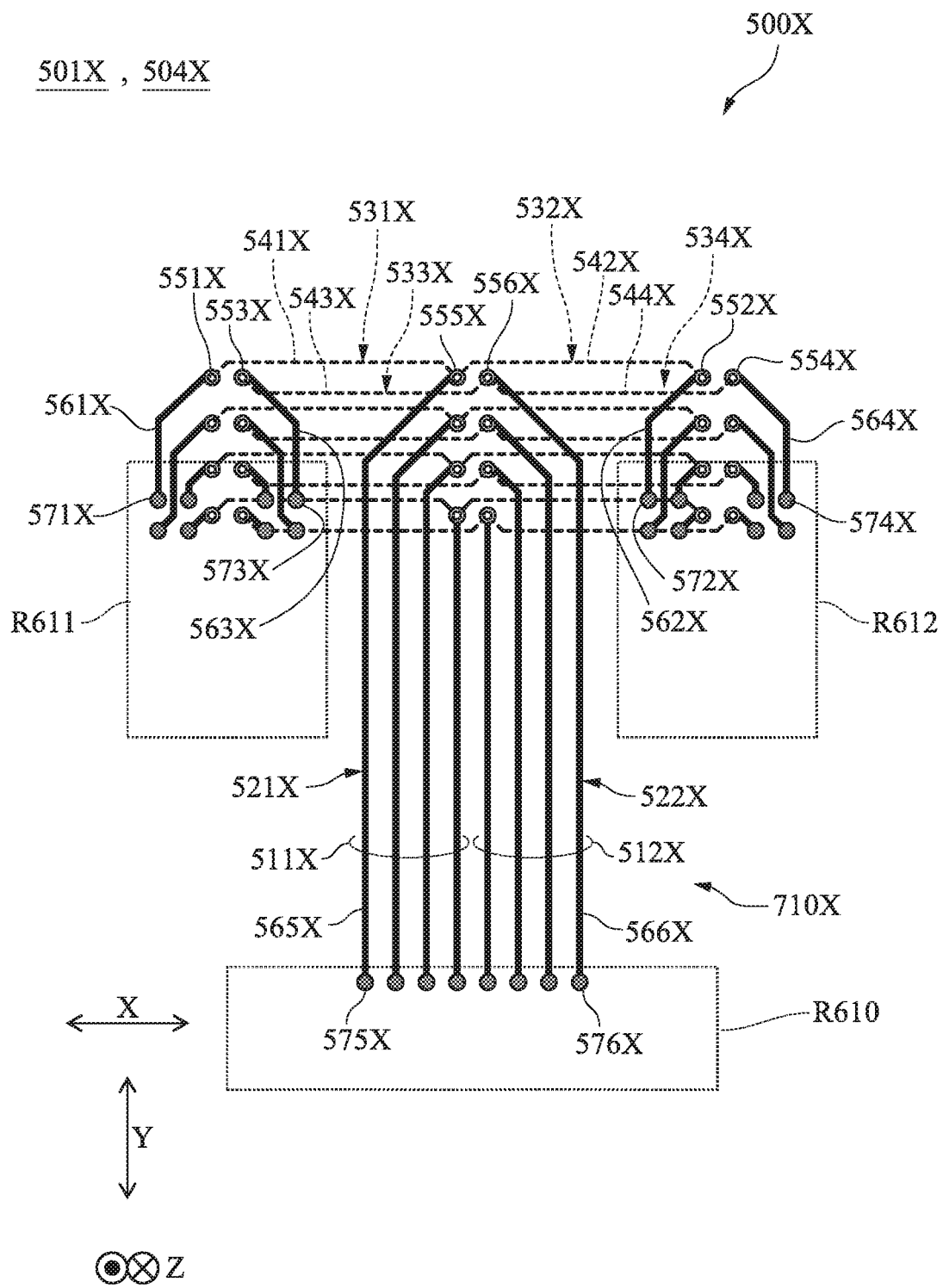
FIG. 7 is a schematic plan view of address/command signal lines of a comparative example.

FIG. 7 is a schematic plan view of address/command signal lines 710X of a printed wiring board 500X of a comparative example. FIG. 7 schematically illustrates wiring of a conductor layer 501X serving as a surface layer and a conductor layer 504X serving as an inner layer among six conductor layers of the printed wiring board 500X. In FIG. 7, conductor patterns disposed in the conductor layer 501X is indicated by thick solid lines, and conductor patterns disposed in the conductor layer 504X is indicated by thin broken lines. In addition, in FIG. 7, a region where a memory controller is mounted is denoted by R610, and regions where two memory devices are mounted are respectively denoted by R611 and R612.

The address/command signal lines 710X include four signal lines 511X and four signal lines 512X. The signal lines 511X and 512X are lines having T-branched structures. Each signal line 511X includes a main line 521X, and branch lines 531X and 532X branching from the main line 521X. Each signal line 512X includes a main line 522X, and branch lines 533X and 534X branching from the main line 522X.

The main line 521X includes a land 575X and a conductor pattern 565X that are disposed in the conductor layer 501X. In addition, the main line 521X includes a via conductor 555X provided in a through hole that is a through via. The land 575X and the via conductor 555X are electrically interconnected by the conductor pattern 565X.

The branch line 531X includes a conductor pattern 541X disposed in the conductor layer 504X and a via conductor 551X provided in a through hole that is a through via. In addition, the branch line 531X includes a conductor pattern 561X and a land 571X that are disposed in the conductor layer 501X. The via conductors 555X and 551X are electrically interconnected by the conductor pattern 541X. The via conductor 551X and the land 571X are electrically interconnected by the conductor pattern 561X.

The branch line 532X includes a conductor pattern 542X disposed in the conductor layer 504X and a via conductor 552X provided in a through hole that is a through via. In addition, the branch line 532X includes a conductor pattern 562X and a land 572X that are disposed in the conductor layer 501X. The via conductors 555X and 552X are electrically interconnected by the conductor pattern 542X. The via conductor 552X and the land 572X are electrically interconnected by the conductor pattern 562X.

The main line 522X includes a land 576X and a conductor pattern 566X that are disposed in the conductor layer 501X. In addition, the main line 522X includes a via conductor 556X provided in a through hole that is a through via. The land 576X and the via conductor 556X are electrically interconnected by the conductor pattern 566X.

The branch line 533X includes a conductor pattern 543X disposed in the conductor layer 504X and a via conductor 553X provided in a through hole that is a through via. In addition, the branch line 533X includes a conductor pattern 563X and a land 573X that are disposed in the conductor layer 501X. The via conductors 556X and 553X are electrically interconnected by the conductor pattern 543X. The via conductor 553X and the land 573X are electrically interconnected by the conductor pattern 563X.

The branch line 534X includes a conductor pattern 544X disposed in the conductor layer 504X and a via conductor 554X provided in a through hole that is a through via. In addition, the branch line 534X includes a conductor pattern 564X and a land 574X that are disposed in the conductor layer 501X. The via conductors 556X and 554X are electrically interconnected by the conductor pattern 544X. The via conductor 554X and the land 574X are electrically interconnected by the conductor pattern 564X.

As described above, in the comparative example of FIG. 7, the conductor patterns 541X to 544X are disposed in the same conductor layer 504X. Therefore, the four conductor patterns 541X and the four conductor patterns 543X need to be disposed with intervals therebetween in the Y direction so as not to interfere with each other. Similarly, the four conductor patterns 542X and the four conductor patterns 544X need to be disposed with intervals therebetween in the Y direction so as not to interfere with each other. Further, the four via conductors 551X, the four via conductors 552X, the four via conductors 553X, the four via conductors 554X, the four via conductors 555X, and the four via conductors 556X are each disposed in one column in the Y direction, that is, are each disposed in four rows and one column. Therefore, as viewed in the Z direction, the area occupied by the branch lines 531X to 534X of the address/command signal lines 710X is large.

Reducing intervals between wires may be also considered for reducing the occupied area. However, when the intervals between the wires are reduced to be smaller than a predetermined interval, crosstalk noise is generated due to electromagnetic coupling between the wires. The crosstalk noise causes disturbance of waveform, and thus causes malfunction of a memory interface.

In contrast, in the first exemplary embodiment, the conductor patterns 541 and 542 of the branch lines 531 and 532 are disposed in a different conductor layer from the conductor patterns 543 and 544 of the branch lines 533 and 534 as illustrated in FIG. 6A. According to the first exemplary embodiment, the area occupied by the branch lines 531 to 534 as viewed in the Z direction can be reduced even in the case where the intervals between the lines are increased to a predetermined interval or more so as to suppress crosstalk between the wires.

Example 1

Figure 8A:
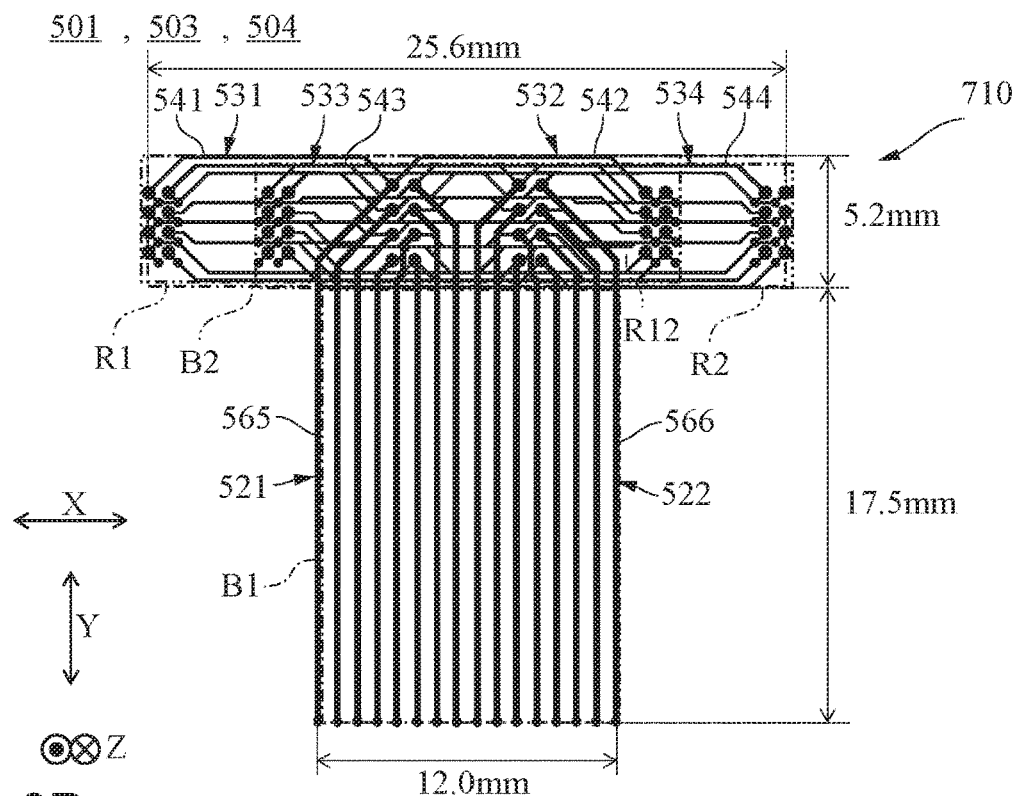
FIG. 8A is a plan view of address/command signal lines of Example 1.

FIG. 8A is a plan view of address/command signal lines of Example 1. FIG. 8A is a wiring diagram drawn with a computer-aided design system: CAD system. The address/command signal lines 710 of Example 1 illustrated in FIG. 8A corresponded to the address/command signal lines 710 of the first exemplary embodiment illustrated in FIG. 6A, but the number thereof was set to 16.

The memory controller and the two memory devices were each a BGA. In the memory controller and the two memory devices, the pitch between the terminals was 0.8 mm.

The printed wiring board of Example 1 was a six-layer board similarly to the first exemplary embodiment as illustrated in FIG. 3. The layer configuration of the printed wiring board is shown in Table 1.

TABLE 1

| Layer name | Thickness |
| --- | --- |
| Conductor layer 501 | 37 μm |
| Insulating layer | 100 μm |
| Conductor layer 502 | 35 μm |
| Insulating layer | 100 μm |
| Conductor layer 503 | 35 μm |
| Insulating layer | 600 μm |
| Conductor layer 504 | 35 μm |
| Insulating layer | 100 μm |
| Conductor layer 505 | 35 μm |
| Insulating layer | 100 μm |
| Conductor layer 506 | 37 μm |

The wire width of the conductor patterns 565 and 566, which were wires provided in the conductor layer 501, was 250 μm. The minimum interval between wires provided in the conductor layer 501 was 550 μm. The wire width of the conductor patterns 541 to 544, which were wires provided in the conductor layers 503 and 504 was 125 μm. The minimum interval between wires provided in the conductor layers 503 and 504 was 175 μm.

The land diameter of via conductor was 500 μm in the conductor layers 501 and 506 illustrated in FIG. 3 serving as surface layers, and was 550 μm in the conductor layers 502 to 505 illustrated in FIG. 3 serving as inner layers. The minimum interval between via conductors was 0.8 mm. In the conductor layers 503 and 504, one wire can be passed through a gap between two via conductors.

The area occupied by the address/command signal lines 710 illustrated in FIG. 8A was calculated. Here, the address/command signal lines 710 were approximated by two rectangular blocks B1 and B2 in a plan view as viewed in the Z direction for the sake of simplification. The blocks B1 and B2 are indicated by one-dot chain lines.

The block B2 was set as the minimum rectangular region including the eight branch lines 531, the eight branch lines 532, the eight branch lines 533, and the eight branch lines 534. The block B1 was set as the minimum rectangular region including a portion of the eight main lines 521 and the eight main lines 522 not overlapping with the block B1.

The areas of the blocks B1 and B2 were each calculated, and the sum of the areas of the two blocks B1 and B2 was set as the area occupied by the address/command signal lines 710. To be noted, the lengths of each of the blocks B1 and B2 in the X direction and the Y direction were measured by setting the centers of wires, the centers of terminals, and the centers of vias as end points. Although the block B1 overlaps with the wire positioned on the outermost side in the X direction, the block B1 is illustrated in FIG. 8A in a displaced manner so as not to overlap with the wire positioned on the outermost side in the X direction for the sake of description.

The length of the block B1 was 17.5 mm in the Y direction and 12.0 mm in the X direction. The area of the block B1 was 210.00 mm². The length of the block B2 was 5.2 mm in the Y direction and 25.6 mm in the X direction. The area of the block B2 was 133.13 mm². As a result of this, the area occupied by the address/command signal lines 710 of Example 1 was 343.12 mm².

In FIG. 8A, the region R1 serving as a first rectangular region including the eight branch lines 531 and the eight branch lines 532 is indicated by a two-dot chain line. The length of the region R1 was 4.9 mm in the Y direction and 21.2 mm in the X direction. The area of the region R1 was 103.88 mm². In addition, the region R2 serving as a second rectangular region including the eight branch lines 533 and the eight branch lines 534 is indicated by a two-dot chain line. The length of the region R2 was 4.9 mm in the Y direction and 21.2 mm in the X direction. The area of the region R2 was 103.88 mm². That is, the area of the region R1 and the area of the region R2 were equal.

The regions R1 and R2 were disposed so as to overlap with each other while being displaced from each other by 0.3 mm, which was the sum of the wire width 125 μm of one line and the line interval 175 μm between two lines, and overlaps with each other by 4.6 mm in the Y direction corresponding to the longitudinal direction of the page of FIG. 8A. The proportion of the length of the portion where the regions R1 and R2 overlap with each other in the Y direction to the length of the region R1 in the Y direction was 94.3%.

In the X direction corresponding to the lateral direction of the page of FIG. 8A, the regions R1 and R2 were disposed to be displaced from each other by 4.4 mm and overlap with each other by 16.8 mm. The proportion of the length of the portion where the regions R1 and R2 overlap with each other in the X direction to the length of the region R1 in the X direction was 79.2%. The area of the region R12 where the regions R1 and R2 partially overlapped with each other was 77.28 mm². The proportion of the region R12 to the area of each of the regions R1 and R2 was 74.3%.

Figure 8B:
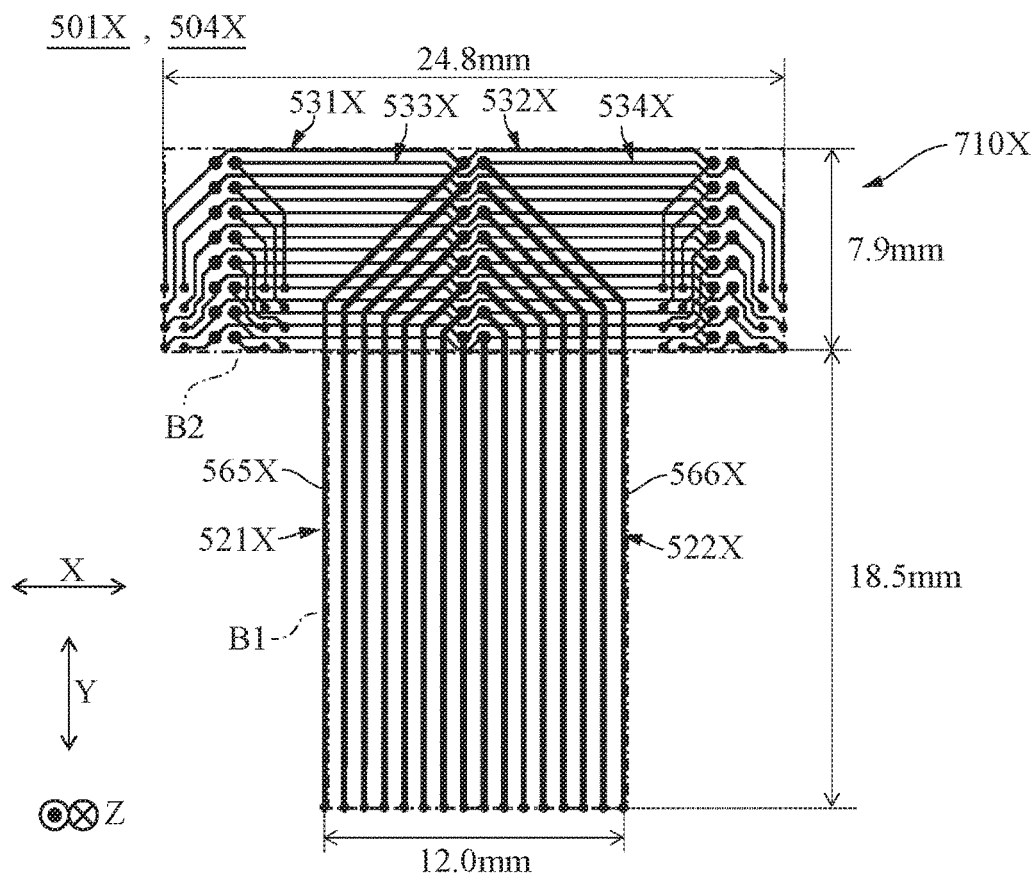
FIG. 8B is a plan view of address/command signal lines of Comparative Example 1.

FIG. 8B of a plan view of address/command signal lines of Comparative Example 1. The address/command signal lines 710X of Comparative Example 1 illustrated in FIG. 8B correspond to the address/command signal lines 710X of the comparative example illustrated in FIG. 7, but the number thereof was set to 16. Although the block B1 overlaps with the wire positioned on the outermost side in the X direction, in FIG. 8B, the block B1 is illustrated in a displaced manner so as not to overlap with the wire positioned on the outermost side in the X direction.

The area of the address/command signal lines 710X was calculated in the same manner as in Example 1. The length of the block B1 was 18.5 mm in the Y direction and 12.0 mm in the X direction. The area of the block B1 was 222.00 mm². The length of the block B2 was 7.9 mm in the Y direction and 24.8 mm in the X direction. The area of the block B2 was 195.92 mm². As a result of this, the area occupied by the address/command signal lines 710X of Example 1 was 417.92 mm².

According to the calculation result described above, in Example 1, an area of 74.80 mm², that is, an area of about 18% was reduced with respect to Comparative Example 1. In addition, the area of the block B2 was also reduced in Example 1 as compared with Comparative Example 1.

Example 2

Next, simulation of a waveform of a signal was performed by using a waveform simulator. As the simulator, HyperLynx available from Mentor Graphics was used. As an address signal, a 600 MHz pseudo random signal was used. The transmission speed of the address signal was set to 1200 Mbps.

Figure 9:
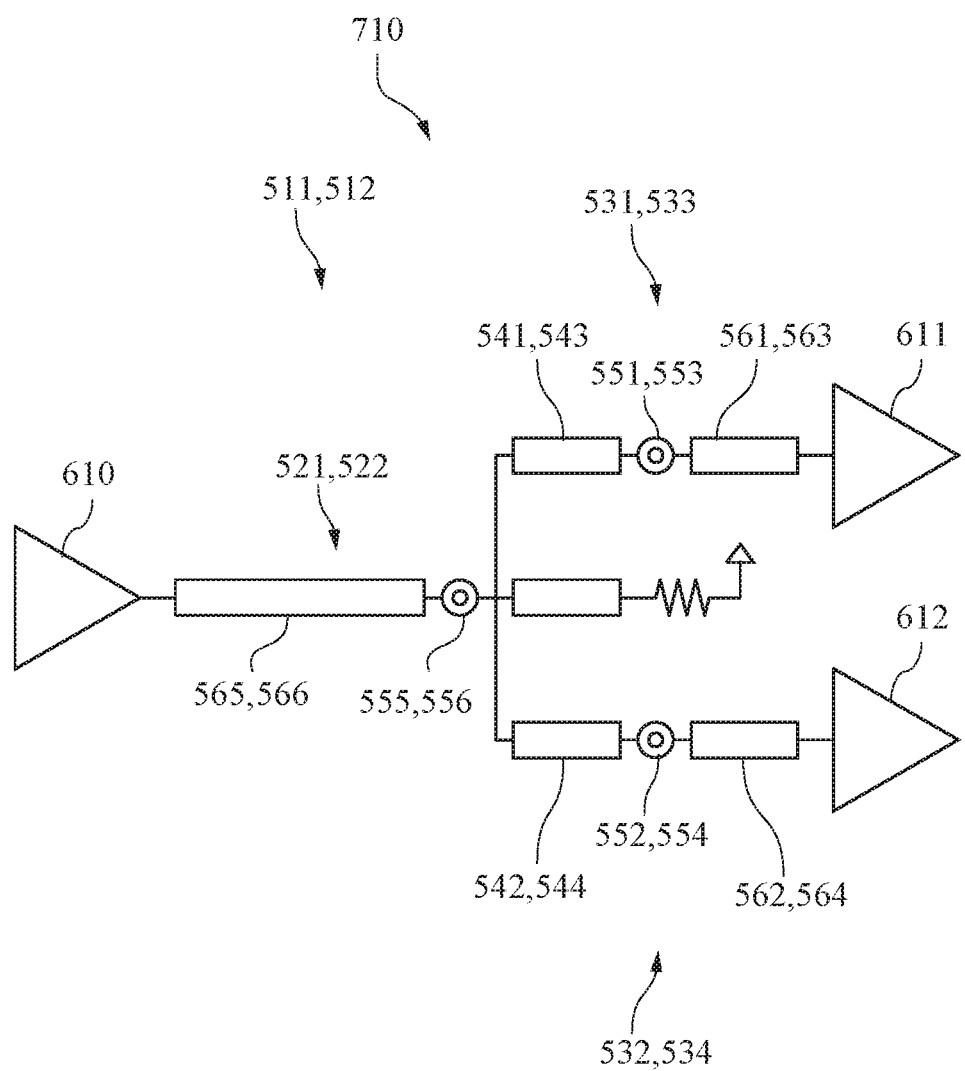
FIG. 9 is a schematic diagram illustrating a model used for simulation in Example 2.

FIG. 9 is a schematic diagram illustrating a model used for the simulation of Example 2. The wire length of the conductor patterns 565 and 566 was set to 22.8 mm. The wire length of the conductor patterns 541 and 543 was set to 11.1 mm. The wire length of the conductor patterns 561 and 563 was set to 0.6 mm. The wire length of the conductor patterns 542 and 544 was set to 11.1 mm. The wire length of the conductor patterns 562 and 564 was set to 0.6 mm.

FIGS. 10A and 10B illustrate graphs showing results of observing a waveform of a signal received by an input portion of an address/command circuit of a memory device. The power source voltage was set to 1200 mV. FIG. 10A illustrates a waveform of a case where the lengths of two branch lines branching from one main line were equal. FIG. 10B illustrates a waveform of a case where the difference between the lengths of the two branch lines branching from one main line was set to 1 mm. An upper limit threshold value of an input voltage to the address/command circuit of the memory device was 700 mV, and a lower limit threshold value of the input voltage was 500 mV. The signal did not go beyond the threshold voltages in a period from transitioning from a Low level corresponding to a logical value of 0 to a High level corresponding to a logical value of 1 from the waveform illustrated in FIG. 10A to then transitioning from the High level to the Low level.

It can be recognized that the waveform illustrated in FIG. 10B was disturbed as compared with the waveform illustrated in FIG. 10A. However, the signal did not go beyond the threshold voltages in a period from transitioning from the Low level corresponding to a logical value of 0 to the High level corresponding to a logical value of 1 to then transitioning from the High level to the Low level.

As described above, by setting the lengths of the branch lines 531 and 533 and the lengths of the branch lines 532 and 534 to be equal, the quality of the signal received by each memory device can be kept high.

Here, as described above, the lengths of the branch lines 531 and 532 being equal means that the difference between the lengths of the branch lines 531 and 532 is equal to or smaller than a predetermined value. Similarly, the lengths of the branch lines 533 and 534 being equal means that the difference between the lengths of the branch lines 533 and 534 is equal to or smaller than a predetermined value. The predetermined value is preferably 1.6 mm. The length of each branch line is 11.1 mm+0.6 mm=11.7 mm. Therefore, in the case where the total wire length of the two branch lines branching from one main line is 23.4 mm, the proportion of the difference to the total wire length of the two branch lines is 1.6 mm/23.4 mm=6.8%. Therefore, a case where the lengths of the two branch lines are equal can be also described as a case where the proportion described above is 6.8% or lower.

Second Exemplary Embodiment

FIG. 11A is a plan view of address/command signal lines 710A of a printed wiring board 500A according to a second exemplary embodiment. FIG. 11A schematically illustrates the address/command signal lines 710A of the second exemplary embodiment. To describe the wiring structure, wires for eight signals are illustrated. In FIG. 11A, conductor patterns disposed in the conductor layer 501 are indicated by thick solid lines, and conductor patterns disposed in the conductor layer 506 are indicated by thick broken lines. In addition, in FIG. 11A, conductor patterns disposed in the conductor layer 503 are indicated by thin solid lines, and conductor patterns disposed in the conductor layer 504 are indicated by thin broken lines. In the second exemplary embodiment, the conductor layer 503 serves as a first conductor layer, the conductor layer 504 serves as a second conductor layer, the conductor layer 501 serves as a third conductor layer, and the conductor layer 506 serves as a fourth conductor layer. To be noted, in the second exemplary embodiment, elements having a similar configuration to the first exemplary embodiment will be denoted by the same reference signs, and description thereof will be omitted.

Part of the second exemplary embodiment different from FIG. 6A will be described with reference to FIG. 11A. To be noted, in FIG. 6A, the conductor pattern 565 of the main line 521 and the conductor pattern 566 of the main line 522 are provided in the conductor layer 501.

In the second exemplary embodiment, as illustrated in FIG. 11A, the address/command signal lines 710A include a plurality of signal lines 511A and a plurality of signal lines 512A. For example, the address/command signal lines 710A include four signal lines 511A and four signal lines 512A. The signal lines 511A and the signal lines 512A are lines having T-branched structures. The signal lines 511A serve as first signal lines, and the signal lines 512A serve as second signal lines.

Each signal line 511A includes a main line 521A, and branch lines 531 and 532 branching from the main line 521A. Each signal line 512A includes a main line 522A, and branch lines 533 and 534 branching from the main line 522A. The main line 521A serves as a first main line, and the main line 522A serves as a second main line.

The branch lines 531 to 534 are as described in the first exemplary embodiment. The branch line 531 includes the conductor pattern 541 disposed in the conductor layer 503. The branch line 532 includes the conductor pattern 542 disposed in the conductor layer 503. The branch line 533 includes the conductor pattern 543 disposed in the conductor layer 504. The branch line 534 includes the conductor pattern 544 disposed in the conductor layer 504.

The main line 521A includes a land 575A, a via conductor 577A, a conductor pattern 565A, and the via conductor 555. The land 575A and the via conductor 577A are disposed at positions overlapping with the region R610 as viewed in the Z direction. The land 575A is disposed in the conductor layer 501. A terminal of an unillustrated memory controller is connected to the land 575A. The land 575A is connected to the via conductor 577A via a conductor pattern.

The conductor pattern 565A serves as a fifth conductor pattern. The via conductor 555 serves as a fifth via conductor. The conductor pattern 565A is disposed in the conductor layer 506, and is formed to extend from the via conductor 555 to a position overlapping with the region R610. The via conductors 577A and 555 are interconnected by the conductor pattern 565A.

The main line 522A includes a land 576A, a conductor pattern 566A, and the via conductor 556. The land 576A is disposed at a position overlapping with the region R610 as viewed in the Z direction. The land 576A is disposed in the conductor layer 501. A terminal of an unillustrated memory controller is connected to the land 576A.

The conductor pattern 566A serves as a sixth conductor pattern. The via conductor 556 serves as a sixth via conductor. The conductor pattern 566A is disposed in the conductor layer 501, and is formed to extend from the via conductor 556 to a position overlapping with the region R610. The land 576A and the via conductor 556 are interconnected by the conductor pattern 566A.

Part of the conductor pattern 566A is disposed to overlap with part of the conductor pattern 565A as viewed in the Z direction. According to this wiring structure, the area occupied by the address/command signal lines 710A can be reduced. To be noted, in FIG. 11A, the conductor pattern 565A and the conductor pattern 566A are illustrated in a slightly displaced manner for description.

It is preferable that the conductor patterns 565A and 566A are provided such that a straight line portion of the conductor pattern 565A extending from the region R610 and a straight line portion of the conductor pattern 566A extending from the region R610 overlap with each other as viewed in the Z direction. As a result of this, the area occupied by the address/command signal lines 710A can be effectively reduced.

Example 3

FIG. 11B is a plan view of address/command signal lines of Example 3. FIG. 11B is a wiring diagram drawn with a CAD system. In Example 3, connection of lines four 16 signals was confirmed by a CAD system. The wiring diagram of FIG. 11B drawn with a CAD system was used for calculating the occupied area.

The memory controller and the two memory devices were each a BGA. In the memory controller and the two memory devices, the pitch between the terminals was 0.8 mm.

The printed wiring board 500A of Example 3 was configured as a six-layer board as illustrated in FIG. 3 or shown in Table 1. The wire width of the conductor pattern 566A, which was a wire provided in the conductor layer 501, was 250 μm. The minimum interval between wires provided in the conductor layer 501 was 550 μm. A ground plane or a power supply line is disposed in the conductor layer 502. The wire width of the conductor patterns 541 to 544, which were wires provided in the conductor layers 503 and 504, was 125 μm. The minimum interval between wires provided in the conductor layers 503 and 504 was 175 μm. A power supply line or a ground plane was disposed in the conductor layer 505. The wire width of the conductor pattern 565A provided in the conductor layer 506 was 250 μm. The minimum interval between wires provided in the conductor layer 506 was 550 μm.

The land diameter of via conductor was 500 μm in the conductor layers 501 and 506 illustrated in FIG. 3 serving as surface layers, and was 550 μm in the conductor layers 502 to 505 serving as inner layers. The minimum interval between via conductors was 0.8 mm. In the conductor layers 503 and 504, one line can be provided between two via conductors.

The area occupied by the address/command signal lines 710A illustrated in FIG. 11B was calculated. Here, the address/command signal lines 710A were approximated by two rectangular blocks B1 and B2 in a plan view as viewed in the Z direction for simplifying the calculation of the area. The blocks B1 and B2 are indicated by one-dot chain lines in FIG. 11B.

The block B2 was set as the minimum rectangular region including the eight branch lines 531, the eight branch lines 532, the eight branch lines 533, and the eight branch lines 534. The block B1 was set as the minimum rectangular region including a portion of the eight main lines 521A and the eight main lines 522A not overlapping with the block B2.

The areas of the blocks B1 and B2 were each calculated, and the sum of the areas of the two blocks B1 and B2 was set as the area occupied by the address/command signal lines 710A. To be noted, the lengths of each of the blocks B1 and B2 in the X direction and the Y direction were measured by setting the center of wiring, the center of terminals, and the center of vias as end points.

The length of the block B1 was 18.3 mm in the Y direction and 9.4 mm in the X direction. The area of the block B1 was 172.02 mm$^2$. The length of the block B2 was 5.2 mm in the Y direction and 22.4 mm in the X direction. The area of the block B2 was 116.48 mm$^2$. As a result of this, the area occupied by the address/command signal lines 710A of Example 3 was 288.50 mm$^2$.

As can be seen from the calculation results described above, in Example 3, an area of 129.42 mm$^2$, that is, an area of about 31% was reduced with respect to Comparative Example 1.

According to Example 3, the area occupied by the block B2 can be reduced more than in Example 1. The reason for this is because the interval between the two memory devices was reduced by reducing the width of the block B1 from 12.0 mm of Example 1 to 9.4 mm of Example 3. Comparing the width of the block B2 between Examples 1 and 3, the width was reduced from 25.6 mm of Example 1 to 22.4 mm of Example 3.

As described above, in Example 3, to reduce the area of the block B1, the main lines 521A and the main lines 522A were disposed in two different conductor layers and were disposed to partially overlap with each other as viewed in the Z direction. Since the bus width of the main lines is reduced, the interval between the two memory devices can be reduced. As a result of this, the branch lines interconnecting the two memory devices can be shortened, and thus the area occupied by the block B2 can be reduced. Therefore, the printed wiring board 500A can be effectively miniaturized. As a result of this, a control module including the printed wiring board 500A can be effectively miniaturized.

To be noted, the present invention is not limited to the exemplary embodiments described above, and can be modified in many ways within the technical concept of the present invention. In addition, the effects described in the exemplary embodiments are merely enumeration of the most preferable effects that can be achieved by the present invention, and are not limited to those described in the exemplary embodiments.

For example, although a case where the memory controller 610 of FIG. 5 is mounted in the region R610 of FIG. 6A or 11A has been described, the configuration is not limited to this. The memory controller 610 may be mounted on a printed wiring board different from the printed wiring boards 500 and 500A. In this case, connectors connected to the memory controller 610 via cables or the like may be mounted on the region R610.

In addition, although a case where six conductor layers are provided in the printed wiring board 500 or 500A has been described in the exemplary embodiments described above, the configuration is not limited to this. It suffices as long as the printed wiring board 500 of the first exemplary embodiment includes three or more conductor layers. In addition, it suffices as long as the printed wiring board 500A of the second exemplary embodiment includes four or more conductor layers.

In addition, although a case where the conductor layer 501 serves as a third conductor layer, the conductor layer 503 serves as a first conductor layer, and the conductor layer 504 serves as a second conductor layer has been described in the first exemplary embodiment, the configuration is not limited to this. It suffices as long as the first to third conductor layers are different conductor layers in the printed wiring board. In addition, although a case where the conductor layer 501 serves as a third conductor layer, the conductor layer 503 serves as a first conductor layer, the conductor layer 504 serves as a second conductor layer, and the conductor layer 506 serves as a fourth conductor layer has been described in the second exemplary embodiment, the configuration is not limited to this. It suffices as long as the first to fourth conductor layers are different conductor layers in the printed wiring board.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-108876, filed Jun. 11, 2019, and Japanese Patent Application No. 2020-82598, filed May 8, 2020, which are hereby incorporated by reference herein in their entirety.

What is claimed is:

1. A printed circuit board comprising:
a printed wiring board; and
a first element and a second element mounted on the printed wiring board with an interval therebetween in a predetermined direction in a plan view,
wherein the printed wiring board comprises a plurality of first signal lines and a plurality of second signal lines serving as transmission paths for signals transmitted to the first element and the second element,
wherein the plurality of first signal lines each comprise:
a first main line,
a first branch line branching from the first main line and extending to a position overlapping with the first element in the plan view, and
a second branch line branching from the first main line and extending to a position overlapping with the second element in the plan view,
wherein the plurality of second signal lines each comprise:
a second main line,
a third branch line branching from the second main line and extending to a position overlapping with the first element in the plan view, and
a fourth branch line branching from the second main line and extending to a position overlapping with the second element in the plan view,
wherein the first branch line comprises a first conductor pattern disposed in a first conductor layer of the printed wiring board and branching from the first main line,
wherein the second branch line comprises a second conductor pattern disposed in the first conductor layer and branching from the first main line,
wherein the third branch line comprises a third conductor pattern disposed in a second conductor layer of the printed wiring board and branching from the second main line, and
wherein the fourth branch line comprises a fourth conductor pattern disposed in the second conductor layer and branching from the second main line.

2. The printed circuit board according to claim 1, wherein a first rectangular region which is set to be a minimum area including the plurality of first branch lines and the plurality of second branch lines comprised in the plurality of first signal lines partially overlaps with a second rectangular region which is set to be a minimum area including the plurality of third branch lines and the plurality of fourth branch lines comprised in the plurality of second signal lines.

3. The printed circuit board according to claim 1, wherein, a length of the first branch line is equal to a length of the second branch line in each first signal line, and a length of the third branch line is equal to a length of the fourth branch line in each second signal line.

4. The printed circuit board according to claim 1,
wherein the first branch line comprises a first via conductor disposed at a position overlapping with the first element in the plan view,
wherein the second branch line comprises a second via conductor disposed at a position overlapping with the second element in the plan view,
wherein the third branch line comprises a third via conductor disposed at a position overlapping with the first element in the plan view,
wherein the fourth branch line comprises a fourth via conductor disposed at a position overlapping with the second element in the plan view,
wherein the first main line comprises a fifth via conductor which is positioned between the first element and the second element in the plan view and from which the first branch line and the second branch line branch, and
wherein the second main line comprises a sixth via conductor which is positioned between the first element and the second element in the plan view and from which the third branch line and the fourth branch line branch.

5. The printed circuit board according to claim 4, wherein the plurality of first via conductors comprised in the plurality of first signal lines, the plurality of second via conductors comprised in the plurality of first signal lines, the plurality of third via conductors comprised in the plurality of second signal lines, the plurality of fourth via conductors comprised in the plurality of second signal lines, the plurality of fifth via conductors comprised in the plurality of first signal lines, and the plurality of sixth via conductors comprised in the plurality of second signal lines are each disposed in a plurality of columns.

6. The printed circuit board according to claim 4, wherein the first via conductor, the second via conductor, the third via conductor, the fourth via conductor, the fifth via conductor, and the sixth via conductor are respectively provided in through holes.

7. The printed circuit board according to claim 4, further comprising a third element mounted on the printed wiring board and connected to the plurality of first main lines comprised in the plurality of first signal lines and the plurality of second main lines comprised in the plurality of second signal lines,
wherein the first main line comprises a fifth conductor pattern provided in a third conductor layer of the printed wiring board and extending from the fifth via conductor to a position overlapping with the third element in the plan view, and
wherein the second main line comprises a sixth conductor pattern provided in the third conductor layer and extending from the sixth via conductor to a position overlapping with the third element in the plan view.

8. The printed circuit board according to claim 4, further comprising a third element mounted on the printed wiring board and connected to the plurality of first main lines comprised in the plurality of first signal lines and the plurality of second main lines comprised in the plurality of second signal lines,
wherein the first main line comprises a fifth conductor pattern provided in a fourth conductor layer of the printed wiring board and extending from the fifth via conductor to a position overlapping with the third element in the plan view, and
wherein the second main line comprises a sixth conductor pattern provided in a third conductor layer of the printed wiring board and extending from the sixth via conductor to a position overlapping with the third element in the plan view.

9. The printed circuit board according to claim 7, wherein the third element is a memory controller.

10. The printed circuit board according to claim 8, wherein each of wire widths of the first conductor pattern and the second conductor pattern is smaller than a wire width of the fifth conductor pattern, and
wherein each of wire widths of the third conductor pattern and the fourth conductor pattern is smaller than a wire width of the sixth conductor pattern.

11. The printed circuit board according to claim 8, wherein the third conductor layer is a surface layer.

12. The printed circuit board according to claim 11, wherein the first element, the second element, and the third element are mounted on the third conductor layer.

13. An electronic device comprising:
a casing; and
the printed circuit board according to claim 1 disposed inside the casing.

14. An image forming apparatus comprising:
a casing;
the printed circuit board according to claim 1 disposed inside the casing; and
an apparatus main unit disposed inside the casing and configured to form an image on a sheet.

15. The printed circuit board according to claim 1, wherein the first conductor layer and the second conductor layer are inner layers.

16. The printed circuit board according to claim 1, wherein the first element and the second element are each a memory device.

17. The printed circuit board according to claim 16, wherein the memory device is a double data rate 4 synchronous dynamic random access memory.

18. A printed wiring board comprising:
a plurality of first signal lines and a plurality of second signal lines serving as transmission paths for signals transmitted to a first element and a second element,
wherein the first element and the second element are respectively mountable in a first mounting region and a second mounting region of the printed wiring board,
wherein an interval is provided between the first mounting region and the second mounting region in a predetermined direction in a plan view,
wherein the plurality of first signal lines each comprise:
a first main line,
a first branch line branching from the first main line and extending to a position overlapping with the first mounting region in the plan view, and
a second branch line branching from the first main line and extending to a position overlapping with the second mounting region in the plan view,
wherein the plurality of second signal line each comprise:
a second main line,
a third branch line branching from the second main line and extending to a position overlapping with the first mounting region in the plan view, and
a fourth branch line branching from the second main line and extending to a position overlapping with the second mounting region in the plan view,
wherein the first branch line comprises a first conductor pattern disposed in a first conductor layer of the printed wiring board and branching from the first main line,
wherein the second branch line comprises a second conductor pattern disposed in the first conductor layer and branching from the first main line,
wherein the third branch line comprises a third conductor pattern disposed in a second conductor layer of the printed wiring board and branching from the second main line, and
wherein the fourth branch line comprises a fourth conductor pattern disposed in the second conductor layer and branching from the second main line.

19. The printed wiring board according to claim 12, wherein a first rectangular region which is set to be a minimum area including the plurality of first branch lines and the plurality of second branch lines comprised in the plurality of first signal lines partially overlaps with a second rectangular region which is set to be a minimum area including the plurality of third branch lines and the plurality of fourth branch lines comprised in the plurality of second signal lines.

20. A printed circuit board comprising:
a printed wiring board; and
a first element and a second element mounted on the printed wiring board with an interval therebetween in a predetermined direction in a plan view,
wherein the printed wiring board comprises a first signal line and a second signal line serving as transmission paths for signals transmitted to the first element and the second element,
wherein the first signal line comprises:
a first main line,
a first branch line branching from the first main line and extending to a position overlapping with the first element in the plan view, and
a second branch line branching from the first main line and extending to a position overlapping with the second element in the plan view,
wherein the second signal line comprises:
a second main line,
a third branch line branching from the second main line and extending to a position overlapping with the first element in the plan view, and
a fourth branch line branching from the second main line and extending to a position overlapping with the second element in the plan view,
wherein the first branch line comprises a first conductor pattern disposed in a first conductor layer of the printed wiring board and branching from the first main line,
wherein the second branch line comprises a second conductor pattern disposed in the first conductor layer and branching from the first main line,
wherein the third branch line comprises a third conductor pattern disposed in a second conductor layer of the printed wiring board and branching from the second main line, and
wherein the fourth branch line comprises a fourth conductor pattern disposed in the second conductor layer and branching from the second main line.

* * * * *